US011309360B2

(12) United States Patent
Joo et al.

(10) Patent No.: US 11,309,360 B2
(45) Date of Patent: Apr. 19, 2022

(54) COLOR CONVERSION SUBSTRATE AND DISPLAY DEVICE

(71) Applicant: Samsung Display Co., Ltd., Yongin-si (KR)

(72) Inventors: Sun Kyu Joo, Suwon-si (KR); Byung Chul Kim, Suwon-si (KR); In Ok Kim, Osan-si (KR); Jae Min Seong, Suwon-si (KR); In Seok Song, Pocheon-si (KR); Keun Chan Oh, Hwaseong-si (KR); Gak Seok Lee, Hwaseong-si (KR); Ji Eun Jang, Suwon-si (KR); Chang Soon Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 78 days.

(21) Appl. No.: 16/591,760

(22) Filed: Oct. 3, 2019

(65) Prior Publication Data

US 2020/0258945 A1    Aug. 13, 2020

(30) Foreign Application Priority Data

Feb. 7, 2019    (KR) .......................... 10-2019-0014573

(51) Int. Cl.
*H01L 27/32*    (2006.01)
*H01L 29/786*    (2006.01)
(Continued)

(52) U.S. Cl.
CPC ........ *H01L 27/322* (2013.01); *H01L 27/3272* (2013.01); *H01L 29/78633* (2013.01); *H01L 51/502* (2013.01); *H01L 51/5237* (2013.01)

(58) Field of Classification Search
CPC .......................... H01L 27/3272; H01L 27/322
See application file for complete search history.

(56) References Cited

U.S. PATENT DOCUMENTS

2011/0084290 A1    4/2011    Nakamura et al.
2017/0240728 A1*   8/2017    Lee ....................... H01L 51/004
(Continued)

FOREIGN PATENT DOCUMENTS

KR    1020180107385    10/2018
WO    2018113348       6/2018

OTHER PUBLICATIONS

Extended European Search Report—European Application No. 20156107.3 dated Jun. 12, 2020.

*Primary Examiner* — Grant S Withers
(74) *Attorney, Agent, or Firm* — Cantor Colburn LLP

(57) ABSTRACT

A color conversion substrate includes a base on which first to third light outputting regions and a light shielding region surrounding the first to third light outputting regions are defined; first to third color filters on the base in the first to third light outputting regions, respectively; a first light shielding member on the first color filter in the light shielding region; a light transmission pattern on the first color filter; a first wavelength conversion pattern on the second color filter and which converts light of a first color into light of a second color; and a second wavelength conversion pattern on the third color filter and which converts the light of the first color into light of a third color. A first opening located in the light shielding region is defined in at least one of the light transmission pattern and the first and second wavelength conversion patterns.

19 Claims, 22 Drawing Sheets

(51) Int. Cl.
*H01L 51/50* (2006.01)
*H01L 51/52* (2006.01)

(56) References Cited

U.S. PATENT DOCUMENTS

| | | |
|---|---|---|
| 2018/0006093 A1 | 1/2018 | Kim et al. |
| 2018/0088404 A1 | 3/2018 | Chae et al. |
| 2018/0113356 A1 | 4/2018 | Lee et al. |
| 2018/0233688 A1 | 8/2018 | Chen et al. |

\* cited by examiner

COLOR CONVERSION SUBSTRATE AND DISPLAY DEVICE

This application claims priority to Korean Patent Application No. 10-2019-0014573, filed on Feb. 7, 2019, and all the benefits accruing therefrom under 35 U.S.C. § 119, the content of which in its entirety is herein incorporated by reference.

BACKGROUND

1. Field

The disclosure relates to a color conversion substrate and a display device including the color conversion substrate.

2. Description of the Related Art

With the development of multimedia, display devices are becoming increasingly important. Accordingly, various display devices such as liquid crystal display devices ("LCD"s) and organic light emitting diode display devices ("OLED"s) are being widely used.

Of the display devices, an OLED includes an organic light emitting diode which is a self-light emitting element. The organic light emitting diode may include two opposing electrodes and an organic light emitting layer interposed therebetween. Electrons and holes provided from the two opposing electrodes may be recombined in the organic light emitting layer to generate excitons. As the generated excitons change from an excited state to a ground state, light may be emitted.

Since the OLED may not need a separate light source, the OLED may be low in power consumption, may be made lightweight and thin, and may have a wide viewing angle, high luminance and contrast, and fast response speed. Due to such desired characteristics, the OLED is drawing attention as next-generation display devices.

In a display device, a color conversion pattern or a wavelength conversion pattern may be provided in each pixel on a light path from a light source to a viewer make each pixel display one primary color.

SUMMARY

Embodiments of the disclosure provide a color conversion substrate which improves display quality by effectively discharging gas generated in a wavelength conversion pattern.

Embodiments of the disclosure also provide a display device with improved display quality by effectively discharging gas generated in a wavelength conversion pattern.

An embodiment of a color conversion substrate includes: a base on which a first light outputting region, a second light outputting region and a third light outputting region sequentially disposed to be spaced apart from each other along a first direction and a light shielding region surrounding each of the first to third light outputting regions are defined; a first color filter disposed on the base and disposed in the first light outputting region and the light shielding region; a second color filter disposed on the base and disposed in the second light outputting region; a third color filter disposed on the base and disposed in the third light outputting region; a first light shielding member disposed on the first color filter and disposed in the light shielding region; a light transmission pattern disposed on the first color filter; a first wavelength conversion pattern disposed on the second color filter, where the first wavelength conversion pattern converts light of a first color into light of a second color; and a second wavelength conversion pattern disposed on the third color filter, where the second wavelength conversion pattern converts the light of the first color into light of a third color, which is different from the second color, wherein a first opening is defined in at least one of the light transmission pattern, the first wavelength conversion pattern and the second wavelength conversion pattern, and the first opening is located in the light shielding region.

An embodiment of a display device includes: a first base on which a first light emitting region and a second light emitting region are defined; a first light emitting element disposed on the first base and disposed in the first light emitting region; a second light emitting element disposed on the first base and disposed in the second light emitting region; a thin-film encapsulation layer disposed on the first light emitting element and the second light emitting element; a second base disposed on the thin-film encapsulation layer, where a first light outputting region overlapping the first light emitting region, a second light outputting region overlapping the second light emitting region and a light shielding region surrounding each of the first to third light outputting regions are defined on the second base; a blue color filter disposed on a surface of the second base facing the thin-film encapsulation layer and disposed in the first light outputting region and the light shielding region; a green color filter disposed on the surface of the second base and disposed in the second light outputting region; a light shielding member disposed on the blue color filter and disposed in the light shielding region; a light transmission pattern disposed on the blue color filter; and a wavelength conversion pattern disposed on the green color filter, where a first opening is defined in at least one of the light transmission pattern and the wavelength conversion pattern, and the first opening is located in the light shielding region.

An embodiment of a display device includes: a base on which a first light emitting region and a second light emitting region are defined; a first light emitting element disposed on the base and disposed in the first light emitting region; a second light emitting element disposed on the base and disposed in the second light emitting region; a thin-film encapsulation layer disposed on the first light emitting element and the second light emitting element; a light shielding member disposed on the thin-film encapsulation layer and disposed along a boundary of each light emitting region; a light transmission pattern disposed on the thin-film encapsulation layer, where the light transmission pattern overlaps the first light emitting region in a plan view; a wavelength conversion pattern disposed on the thin-film encapsulation layer, where the wavelength conversion pattern overlaps the second light emitting region in the plan view; a first color filter disposed on the light transmission pattern; and a second color filter disposed on the wavelength conversion pattern, where a first opening is defined in at least one of the light transmission pattern and the wavelength conversion pattern, and the first opening overlaps the light shielding member in the plan view.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1:
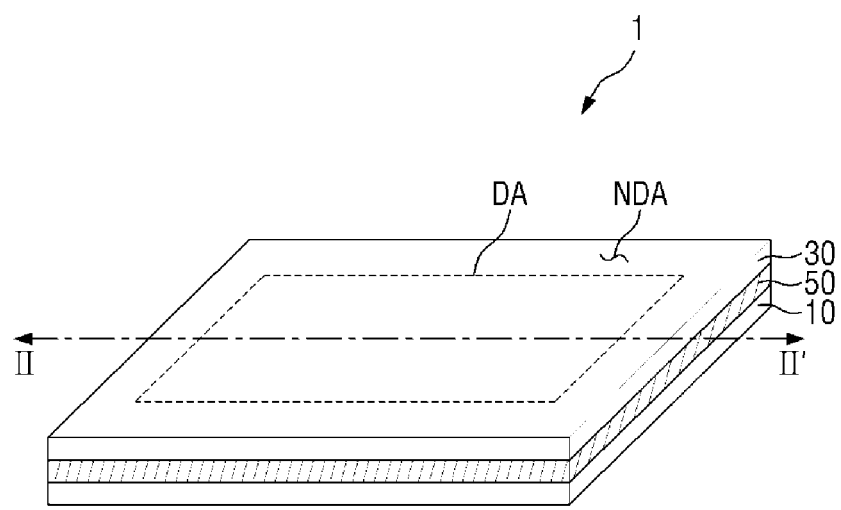
FIG. 1 is a perspective view of a display device according to an embodiment.
Figure 1:
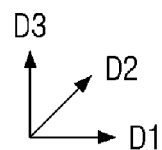

Features of the invention and methods of accomplishing the same may be understood more readily by reference to the following detailed description of embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims. Like reference numerals refer to like elements throughout the specification.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Exemplary embodiments of the invention will be described with reference to perspective views, cross-sectional views, and/or plan views, in which exemplary embodiments of the invention are shown. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described with reference to the accompanying drawings.

Figure 2:
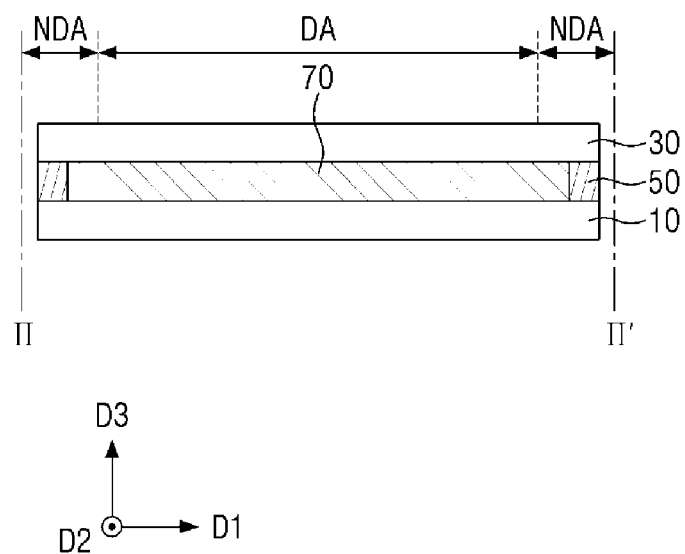
FIG. 2 is a schematic cross-sectional view of the display device, taken along line II-II' of FIG. 1.

FIG. 1 is a perspective view of a display device 1 according to an embodiment. FIG. 2 is a schematic cross-sectional view of the display device 1, taken along line II-II' of FIG. 1.

Referring to FIGS. 1 and 2, an embodiment of the display device 1 is applicable to various electronic devices including small and medium-sized electronic devices such as a tablet personal computer ("PC"), a smartphone, a car navigation unit, a camera, a center information display ("CID") provided in a car, a wristwatch-type electronic device, a personal digital assistant ("PDA"), a portable multimedia player ("PMP") and a game machine and medium and large-sized electronic devices such as a television, an external billboard, a monitor, a PC and a laptop computer. However, these are merely exemplary, and the display device 1 is also applicable to other electronic devices without departing from the concept of the disclosure.

The display device 1 may be rectangular in a plan view. Herein, the phrase "in a plan view" means "when viewed from a plan view in a thickness direction thereof." The display device 1 may include opposing short sides extending in a first direction D1 and opposing long sides extending in a second direction D2 intersecting the first direction D1. Corners at which the long sides and the short sides of the display device 1 meet each other may be right-angled, but may also be curved or rounded. The planar shape of the display device 1 is not limited to those shown in the drawings, but may also be modified to have a circular or other shape.

The display device 1 may include a display area DA which displays an image and a non-display area NDA which does not display an image. The non-display area NDA may be around the display area DA and may surround the display area DA.

Unless otherwise defined, the terms "on," "above," "upper," "top," and "upper surface" used herein denote a direction in which an arrow indicating a third direction D3 perpendicular to the first direction D1 and the second direction D2 points in the drawings, and the terms "under," "below." "lower," "bottom," and "lower surface" used herein denote a direction opposite to the direction in which the arrow indicating the third direction D3 points in the drawings.

In an embodiment, as shown in FIGS. 1 and 2, the display device 1 may include a display substrate 10 and a color conversion substrate 30 facing the display substrate 10 and may further include a sealing portion 50 for bonding the display substrate 10 and the color conversion substrate 30 and a filler 70 for filling a space between the display substrate 10 and the color conversion substrate 30.

The display substrate 10 may include elements and circuits (e.g., pixel circuits such as switching elements) for displaying an image, a pixel defining layer for defining light emitting regions and a non-light emitting region in the display area DA, and self-light emitting elements. In an embodiment, the self-light emitting elements may include at least one of an organic light emitting diode, a quantum dot light emitting diode, an inorganic-based micro light emitting diode (e.g., a micro LED), and an inorganic-based nano light emitting diode (e.g., a nano LED). For ease of description, embodiments where the self-light emitting elements are organic light emitting diodes will hereinafter be described in detail.

The color conversion substrate 30 may be located (or disposed) on the display substrate 10 and may face the display substrate 10. The color conversion substrate 30 may include a light modulation pattern that changes the color of incident light or changes the direction of the incident light. The light modulation pattern may include at least any one of a color filter and a wavelength conversion pattern.

The sealing portion 50 may be located between the display substrate 10 and the color conversion substrate 30 in the non-display area NDA. The sealing portion 50 may be disposed in the non-display area NDA along edges of the display substrate 10 and the color conversion substrate 30 to surround the display area DA in a plan view. The display substrate 10 and the color conversion substrate 30 may be coupled or bonded to each other by the sealing portion 50.

The sealing portion 50 may include or be made of an organic material. In one embodiment, for example, the sealing portion 50 may include or be made of epoxy resin.

The filler 70 may be located in a space between the display substrate 10 and the color conversion substrate 30 surrounded by the sealing portion 50. The filler 70 may fill the space between the display substrate 10 and the color conversion substrate 30.

The filler 70 may include or be made of a transparent material or a material capable of transmitting light. The filler 70 may include or be made of an organic material. In one embodiment, for example, the filler 70 may include or be made of a silicon-based organic material or an epoxy-based organic material. In an alternative embodiment, the filler 70 may be omitted.

Figure 3:
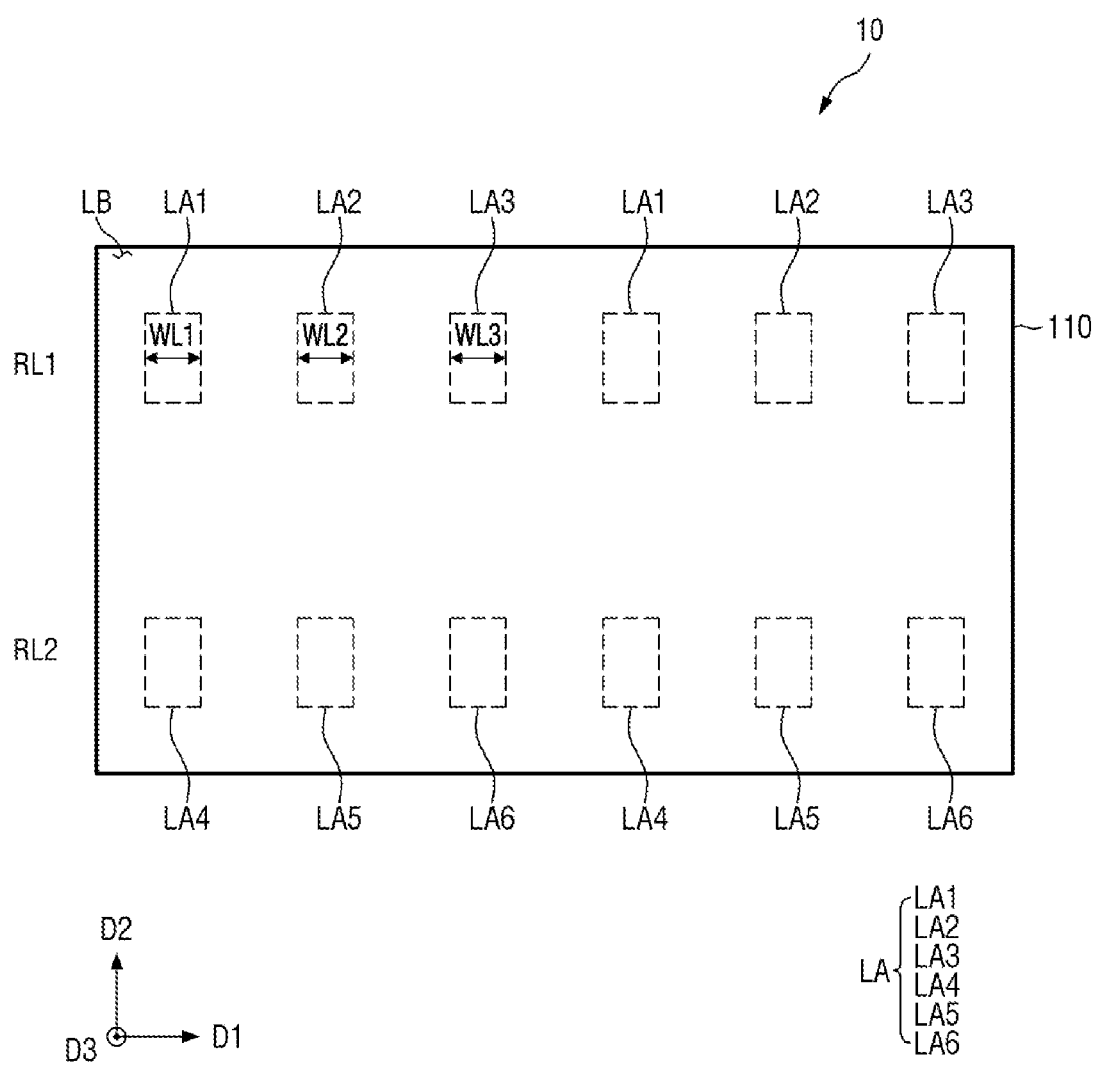
FIG. 3 is a schematic plan view of a display substrate in a display area of the display device illustrated in FIGS. 1 and 2.
Figure 4:
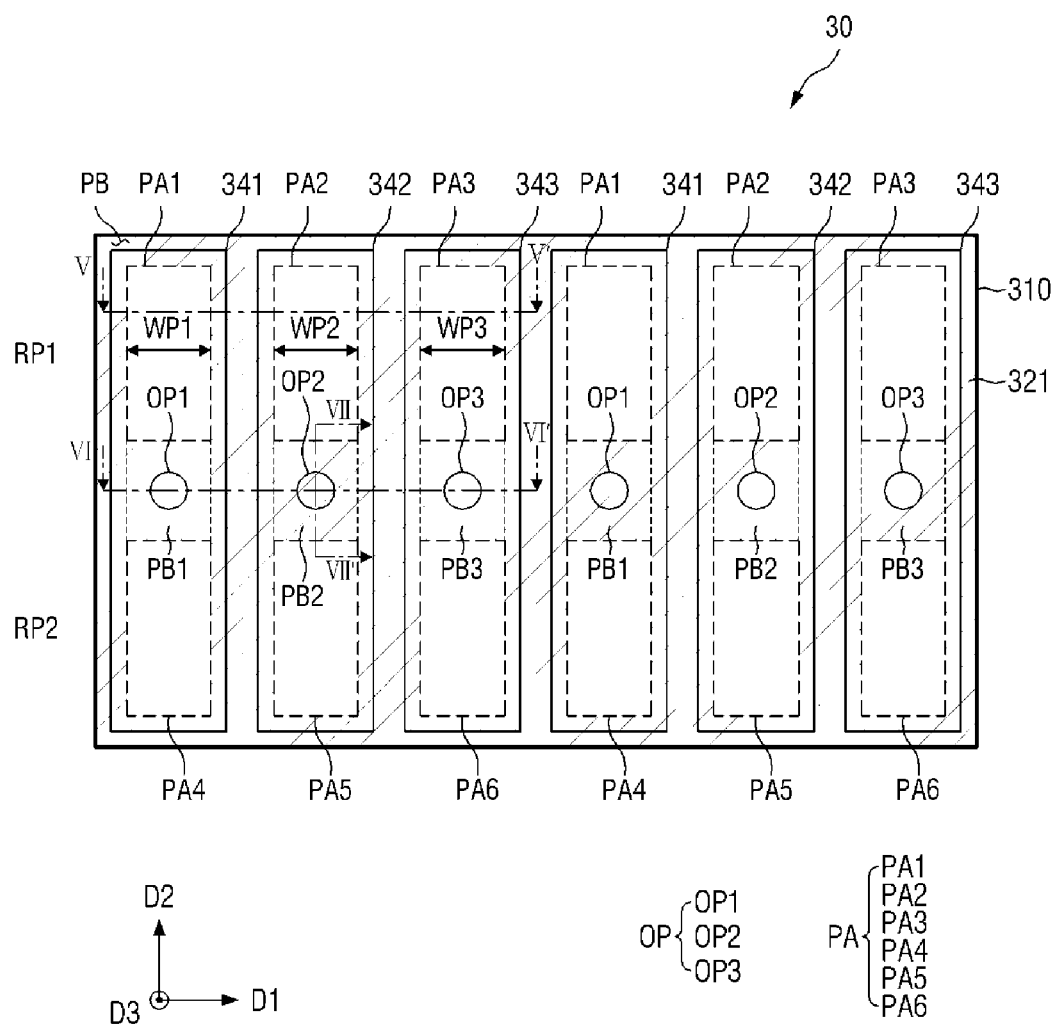
FIG. 4 is a schematic plan view of a color conversion substrate in the display area of the display device illustrated in FIGS. 1 and 2.

FIG. 3 is a schematic plan view of the display substrate 10 in the display area DA of the display device 1 illustrated in FIGS. 1 and 2. FIG. 4 is a schematic plan view of the color conversion substrate 30 in the display area DA of the display device 1 illustrated in FIGS. 1 and 2.

Referring to FIGS. 3 and 4 in addition to FIGS. 1 and 2, a plurality of light emitting regions LA1 through LA6 and a non-light emitting region LB may be defined in the display area DA of the display substrate 10. Each of the light emitting regions LA1 through LA6 may be a region where light generated by a light emitting element of the display substrate 10 is emitted out of the display substrate 10, and the non-light emitting region LB may be a region where light is not emitted out of the display substrate 10.

Light emitted out of the display substrate 10 in each of the light emitting regions LA1 through LA6 may be light of a first color. In an embodiment, the light of the first color may be blue light and may have a peak wavelength in a range of about 430 nanometers (nm) to about 470 nm.

In an embodiment, as shown in FIG. 3, a first light emitting region LA1, a second light emitting region LA2, and a third light emitting region LA3 may be sequentially repeated along the first direction D1 in a first row RL1 of the display substrate 10 in the display area DA. In such an embodiment, a fourth light emitting region LA4, a fifth light emitting region LA5, and a sixth light emitting region LA6 may be sequentially repeated along the first direction D1 in a second row RL2 adjacent to the first row RL1 along the second direction D2.

A first width WL1 of the first light emitting region LA1 measured along the first direction D1 may be smaller than a second width WL2 of the second light emitting region LA2 and a third width WL3 of the third light emitting region LA3 measured along the first direction D1. The second width WL2 of the second light emitting region LA2 and the third width WL3 of the third light emitting region LA3 may be different from each other. In one embodiment, for example, the second width WL2 of the second light emitting region LA2 may be smaller than the third width WL3 of the third light emitting region LA3. The area of the first light emitting region LA1 may be substantially equal to or larger than the area of the second light emitting region LA2 or the area of the third light emitting region LA3.

The fourth light emitting region LA4 adjacent to the first light emitting region LA1 along the second direction D2 is different from the first light emitting region LA1 only in that the fourth light emitting region LA4 is located in the second row RL2 and may be substantially the same as the first light emitting region LA1 in width, area and the structure of elements disposed in a region.

In such an embodiment, the second light emitting region LA2 and the fifth light emitting region LA5 adjacent to each other along the second direction D2 may have substantially a same structure as each other, and the third light emitting region LA3 and the sixth light emitting region LA6 adjacent to each other along the second direction D2 may have substantially a same structure as each other.

In an embodiment, as shown in FIG. 4, a plurality of light outputting regions PA1 through PA6 and a light shielding region PB may be defined in the color conversion substrate 30 in the display area DA. Each of the light outputting regions PA1 through PA6 may be a region where light emitted from the display substrate 10 is transmitted through the color conversion substrate 30 and provided to an outside of the display device 1. The light shielding region PB may be a region through which light emitted from the display substrate 10 is blocked or not transmitted.

A first light outputting region PA1, a second light outputting region PA2 and a third light outputting region PA3 may be sequentially repeated along the first direction D1 in a first row RP1 of the color conversion substrate 30 in the display area DA. In an embodiment, the first light outputting region PA1 may correspond to the first light emitting region LA1 or may overlap the first light emitting region LA1. In such an embodiment, the second light outputting region PA2 may correspond to the second light emitting region LA2, and the third light outputting region PA3 may correspond to the third light emitting region LA3.

Light of the first color provided from the display substrate 10 may be transmitted to the outside of the display device 1 through the first light outputting region PA1, the second light outputting region PA2 and the third light outputting region PA3. Light emitted out of the display device 1 in the first light outputting region PA1 will be referred to as first output light, light emitted out of the display device 1 in the second light outputting region PA2 will be referred to as second output light, and light emitted out of the display device 1 in the third light outputting region PA3 will be referred to as third output light. In an embodiment, the first output light may be light of the first color, the second output light may be light of a second color different from the first color, and the third output light may be light of a third color different from the first color and the second color. In an embodiment, the light of the first color may be blue light having a peak wavelength in the range of about 430 nm to about 470 m, as described above, and the light of the second color may be green light having a peak wavelength in a range of about 510 nm to about 550 nm. In such an embodiment, the light of the third color may be red light having a peak wavelength in a range of about 610 nm to about 650 nm.

A fourth light outputting region PA4, a fifth light outputting region PA5 and a sixth light outputting region PA6 may be sequentially repeated along the first direction D1 in a second row RP2 adjacent to the first row RP1 along the second direction D2. The fourth light outputting region PA4 may correspond to the fourth light emitting region LA4, the fifth light outputting region PA5 may correspond to the fifth light emitting region LA5, and the sixth light outputting region PA6 may correspond to the sixth light emitting region LA6.

In such an embodiment, the second light emitting region LA2 and the third light emitting region LA3, a first width WP1 of the first light outputting region PA measured along the first direction D1 may be smaller than a second width WP2 of the second light outputting region PA2 and a third width WP3 of the third light outputting region PA3 measured along the first direction D1. However, the disclosure is not limited thereto, and the second width WP2 of the second light outputting region PA2 and the third width WP3 of the third light outputting region PA3 may also be different from each other. In one embodiment, for example, the second width WP2 of the second light outputting region PA2 may be smaller than the third width WP3 of the third light outputting region PA3. In an embodiment, the area of the first light outputting region PA1 may be substantially equal to or larger than the area of the second light outputting region PA2 or the area of the third light outputting region PA3.

In an embodiment, the first light outputting region PA1 and the fourth light outputting region PA4 adjacent to each other along the second direction D2 may be substantially the same in width, area, the structure of elements disposed in a region and the color of light emitted out of the display device 1.

In such an embodiment, the second light outputting region PA2 and the fifth light outputting region PA5 adjacent to each other along the second direction D2 may have substantially a same structure as each other and may be substantially the same as each other in the color of light emitted thereof. In such an embodiment, the third light outputting region PA3 and the sixth light outputting region PA6 adjacent to each other along the second direction D2 may have substantially a same structure as each other and may be substantially the same as each other in the color of light emitted out thereof.

The light shielding region PB may be located around the light outputting regions PA1 through PA6 of the color conversion substrate 30 in the display area DA. The light shielding region PB may surround each of the light outputting regions PA1 through PA6. The light shielding region PB may overlap a first light shielding member 321 disposed on a second base (or a second base substrate) 310.

The light shielding region PB may include a first light shielding region PB1, a second light shielding region PB2, and a third light shielding region PB3. In an embodiment, the first light shielding region PB1 may be located between the first light outputting region PA1 and the fourth light outputting region PA4 along the second direction D2, the second light shielding region PB2 may be located between the second light outputting region PA2 and the fifth light outputting region PA5 along the second direction D2, and the third light shielding region PB3 may be located between the third light outputting region PA3 and the sixth light outputting region PA6 along the second direction D2.

A light modulation pattern 340 (shown in FIG. 5) may include a light transmission pattern 341 overlapping the first light outputting region PA1 and the fourth light outputting region PA4, a first wavelength conversion pattern 342 overlapping the second light outputting region PA2 and the fifth light outputting region PA5, and a second wavelength conversion pattern 343 overlapping the third light outputting region PA3 and the sixth light outputting region PA6.

The light transmission pattern 341, the first wavelength conversion pattern 342, and the second wavelength conversion pattern 343 may be repeatedly and sequentially disposed along the second direction D2. In such an embodiment, the light transmission pattern 341 may overlap the first light shielding region PB1 located between the first light outputting region PA1 and the fourth light outputting region PA4, the first wavelength conversion pattern 342 may overlap the second light shielding region PB2 located between the second light outputting region PA2 and the fifth light outputting region PA5, and the second wavelength conversion pattern 343 may overlap the third light shielding region PB3 located between the third light outputting region PA3 and the sixth light outputting region PA6.

A plurality of openings OP1 through OP3 may be defined in the light shielding regions PB1 through PB3, respectively. The openings OP1 through OP3 may overlap the light shielding region PB and may be defined or formed on the light modulation pattern 340 of the color conversion substrate 30 to effectively discharge the gas inside the light modulation pattern 340.

A plurality of openings OP may be defined or formed in the light modulation pattern 340. In an embodiment, a first opening OP1 may be defined or formed to overlap the first light shielding region PB1 between the first light outputting region PA1 and the fourth light outputting region PA4. A second opening OP2 may be defined or formed to overlap the second light shielding region PB2 between the second light outputting region PA2 and the fifth light outputting region PA5. A third opening OP3 may be defined or formed to overlap the third light shielding region PB3 between the third light outputting region PA3 and the sixth light outputting region PA6.

The structure of the display device 1 will hereinafter now be described in greater detail.

Figure 5:
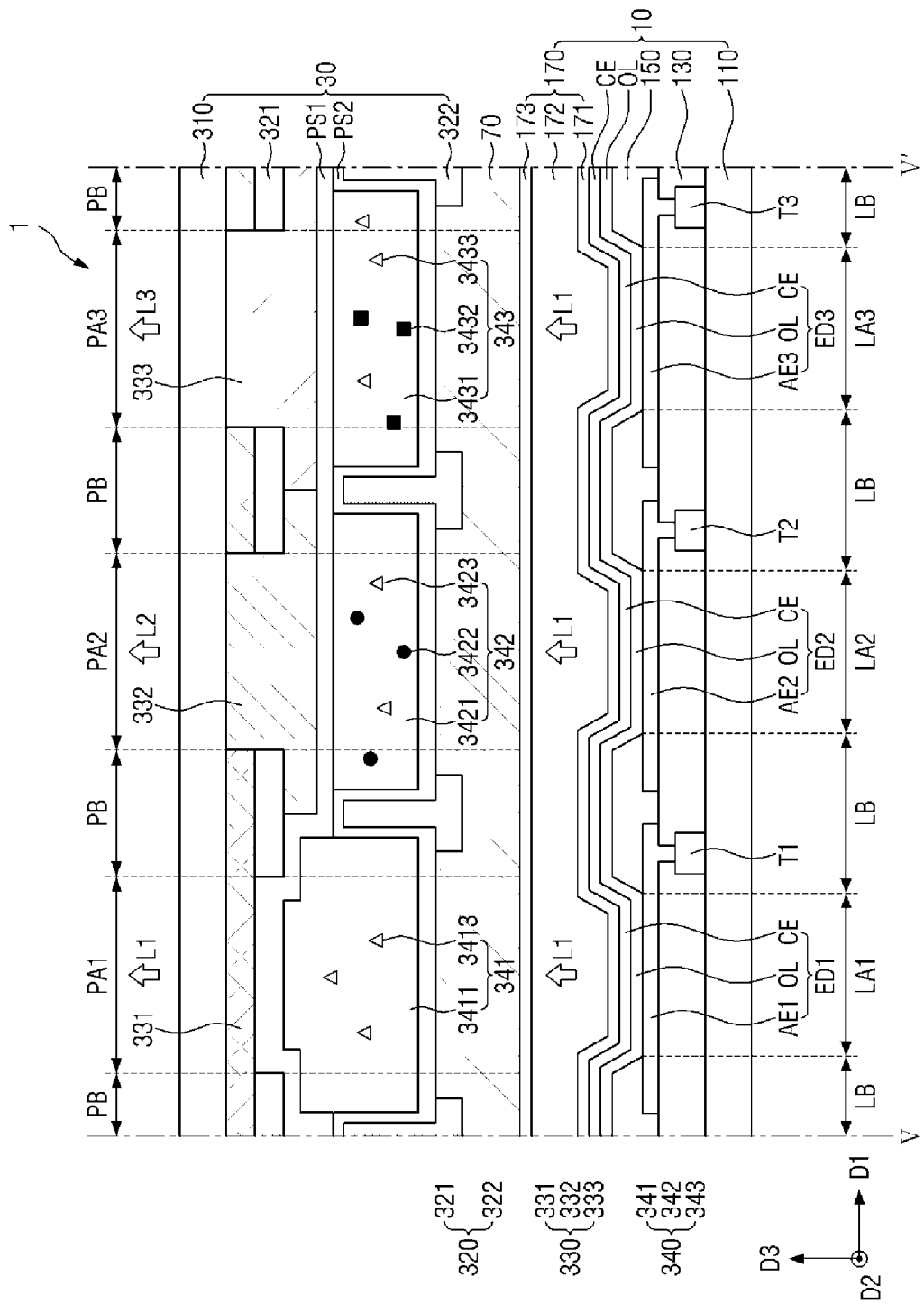
FIG. 5 is a cross-sectional view of an embodiment of the display device, taken along line V-V' of FIGS. 3 and 4.

FIG. 5 is a cross-sectional view of an embodiment of the display device 1, taken along line V-V' of FIGS. 3 and 4.

Referring to FIG. 5 in addition to FIGS. 3 and 4, an embodiment of the display device 1 may include the display substrate 10 and the color conversion substrate 30 and may further include the filler 70 located between the display substrate 10 and the color conversion substrate 30 as described above.

A first base (or a first base substrate) 110 may include or be made of a light transmitting material. In one embodiment, for example, the first base 110 may include a glass substrate or a plastic substrate. In an embodiment, where the first base 110 includes a plastic substrate, the first base 110 may have flexibility. The first base 110 may further include a layer such as a buffer layer or an insulating layer located on the glass substrate or the plastic substrate.

The light emitting regions LA1 through LA6 and the non-light emitting region LB may be defined in the first base 110 as described above.

In an embodiment, as illustrated in FIG. 5, switching elements T1 through T3 may be located on the first base 110. A first switching element T1, a second switching element T2 and a third switching element T3 may be disposed in the non-light emitting region LB. However, the disclosure is not limited thereto. In an alternative embodiment, the first switching element T1 may be located in the first light emitting region LA1, the second switching element T2 may be located in the second light emitting region LA2, and the third switching element T3 may be located in the third light emitting region LA3.

Although not illustrated in the drawings, a plurality of signal lines (e.g., a gate line, a data line, a power supply line, etc.) for transmitting signals to each switching element T1, T2 or T3 may be further disposed on the first base 110.

An insulating layer 130 may be located on the first switching element T1, the second switching element T2 and the third switching element T3. In one embodiment, for example, the insulating layer 130 may be a planarization layer. In an embodiment, the insulating layer 130 may include or be made of an organic layer. The insulating layer 130 may include, for example, acrylic resin, epoxy resin, imide resin, or ester resin. The insulating layer 130 may include a positive photosensitive material or a negative photosensitive material.

In an embodiment, as illustrated in FIG. 5, a first anode AE1, a second anode AE2 and a third anode AE3 may be located on the insulating layer 130. The first anode AE1 may be located in the first light emitting region LA1, but at least a portion of the first anode AE1 may extend to the non-light emitting region LB. The second anode AE2 may be located in the second light emitting region LA2, but at least a portion of the second anode AE2 may extend to the non-light emitting region LB. The third anode AE3 may be located in the third light emitting region LA3, but at least a portion of the third anode AE3 may extend to the non-light emitting region LB. The first anode AE1 may be disposed through the insulating layer 130 and be connected to the first switching element T1, the second anode AE2 may be disposed through the insulating layer 130 and be connected to the second switching element T2, and the third anode AE3 may be disposed through the insulating layer 130 and be connected to the third switching element T3.

The first anode AE1, the second anode AE2 and the third anode AE3 may be different from each other in width or area.

In an embodiment, the first anode AE1, the second anode AE2 and the third anode AE3 may be reflective electrodes. In such an embodiment, each of the first anode AE1, the second anode AE2 and the third anode AE3 may be a metal layer including a metal such as Ag, Mg, Al, Pt, Pd, Au, Ni, Nd, Ir or Cr. In an embodiment, each of the first anode AE1, the second anode AE2 and the third anode AE3 may further include a metal oxide layer stacked on the metal layer. In an embodiment, each of the first anode AE1, the second anode AE2 and the third anode AE3 may have a two-layer structure of indium tin oxide ("ITO")/Ag, Ag/ITO, ITO/Mg or ITO/MgF or a three-layer structure of ITO/Ag/ITO.

A pixel defining layer 150 may be located on the first anode AE1, the second anode AE2 and the third anode AE3. An opening exposing the first anode AE1, an opening exposing the second anode AE2 and an opening exposing the third anode AE3 may be defined through the pixel defining layer 150 such that the pixel defining layer 150 may define the first light emitting region LA1, the second light emitting region LA2, the third light emitting region LA3 and the non-light emitting region LB. In such an embodiment, a region of the first anode AE1 which is not covered by the pixel defining layer 150 may be the first light emitting region LA1. In such an embodiment, a region of the second anode AE2 which is not covered by the pixel defining layer 150 may be the second light emitting region LA2, and a region of the third anode AE3 which is not covered by the pixel defining layer 150 may be the third light emitting region LA3. In such an embodiment, a region where the pixel defining layer 150 is not located may be the non-light emitting region LB.

The pixel defining layer 150 may include an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene ("BCB").

An organic light emitting layer OL may be located on the first anode AE1, the second anode AE2 and the third anode AE3. The organic light emitting layer OL may emit light L1 of the first color, for example, blue light. In such an embodiment, the organic light emitting layer OL may include a blue light emitting layer. In an embodiment, the organic light emitting layer OL may include two or more blue light emitting layers and may further include a charge generation layer located between the two blue light emitting layers.

The organic light emitting layer OL may extend continuously over the light emitting regions LA1 through LA6 and the non-light emitting region LB.

A cathode CE may be located on the organic light emitting layer OL. The cathode CE may have translucency or transparency. In an embodiment, where the cathode CE has translucency, the cathode CE may include Ag, Mg, Cu, Al, Pt, Pd, Au, Ni, Nd, Ir, Cr, Li, Ca, LiF/Ca, LiF/Al, Mo, Ti, or a compound or mixture of the same (e.g., a mixture of Ag and Mg). In such an embodiment, the thickness of the cathode CE may be tens to hundreds of angstroms, such that the cathode CE may have translucency.

In an alternative embodiment, where the cathode CE has transparency, the cathode CE may include transparent conductive oxide ("TCO"). In one embodiment, for example, the cathode CE may include tungsten oxide (WxOx), titanium oxide ($TiO_2$), ITO, indium zinc oxide ("IZO"), zinc oxide (ZnO), indium tin zinc oxide ("ITZO"), or magnesium oxide (MgO).

The anode AE1, the organic layer OL and the cathode CE may constitute or collective define a first organic light emitting diode ED1. The second anode AE2, the organic layer OL and the cathode CE may constitute or collective define a second organic light emitting diode ED2. The third anode AE3, the organic layer OL and the cathode CE may constitute or collective define a third organic light emitting diode ED3. Each of the first organic light emitting diode ED1, the second organic light emitting diode ED2 and the third organic light emitting diode ED3 may provide the light L1 of the first color, for example, blue light to the color conversion substrate 30.

A thin-film encapsulation layer 170 is disposed on the cathode CE. The thin-film encapsulation layer 170 is disposed in all of the first light emitting region LA1, the second light emitting region LA2, the third light emitting region LA3 and the non-light emitting region LB. In an embodiment, the thin-film encapsulation layer 170 directly covers the cathode CE, In an alternative embodiment, a capping layer (not illustrated) covering the cathode CE may be further disposed between the thin-film encapsulation layer 170 and the cathode CE, In such an embodiment, the thin-film encapsulation layer 170 may directly cover the capping layer.

The thin-film encapsulation layer 170 may include a first encapsulating inorganic layer 171, an encapsulating organic layer 172, and a second encapsulating inorganic layer 173 sequentially stacked on the cathode CE.

Each of the first encapsulating inorganic layer 171 and the second encapsulating inorganic layer 173 may include or be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride.

The encapsulating organic layer 172 may include or be made of acrylic resin, methacrylic resin, polyisoprene, vinyl resin, epoxy resin, urethane resin, cellulose resin, or perylene resin.

The stacked structure of the thin-film encapsulation layer 170 is not limited to those shown in FIG. 5, but may be variously modified.

The color conversion substrate 30 will now be described in greater detail.

The light outputting regions PA1 through PA6 and the light shielding region PB may be defined in the second base 310 as illustrated in FIG. 4.

In an embodiment, the color conversion substrate 30 may include the second base 310, a color filter 330 disposed on the second base 310, and the light modulation pattern 340 disposed on the color filter 330. In such an embodiment, the color conversion substrate 30 may include the first light shielding member 321 and a second light shielding member 322 overlapping the light shielding region PB.

The color filter 330 may include a first color filter 331, a second color filter 332, and a third color filter 333.

The first color filter 331 may be disposed on a surface of the second base 310 and may at least partially overlap the first light outputting region PA1 and the fourth light outputting region PA4. The first color filter 331 may be disposed continuously along the second direction D2 in the first light outputting region PA1 and the fourth light outputting region PA4. However, the disclosure is not limited thereto. Alternatively, the first color filter 331 located in the first light outputting region PA1 and the first color filter 331 located in the fourth light outputting region PA4 may also be spaced apart from each other along the second direction D2.

In an embodiment, the first color filter 331 may overlap the light shielding region PB. In such an embodiment, the first color filter 331 may surround each of the light outputting regions PA1 through PA6 in a plan view. The first color filter 331 may at least partially overlap the first light outputting region PA1 and the fourth light outputting region PA4, but may not overlap the second light outputting region PA2, the third light outputting region PA3, the fifth light outputting region PA5, and the sixth light outputting region PA6.

The first color filter 331 may transmit only light of the first color (e.g., blue light) and block or absorb light of the second color (e.g., green light) and light of the third color (e.g., red light). In one embodiment, for example, the first color filter 331 may be a blue color filter and may include a blue colorant such as a blue dye or a blue pigment.

The first color filter 331 overlapping the light shielding region PB may reduce reflected light due to external light by absorbing a portion of light incident on the color conversion substrate 30 from the outside of the display device 1. A considerable portion of external light may be reflected to distort a color gamut of the color conversion substrate 30. In an embodiment, the first color filter 331 is located on the second base 310 to overlap the light shielding region PB, such that distortion of color due to reflection of external light may be reduced.

External light or reflected light that passed through the first color filter 331 has a blue wavelength band. A user's eye color sensitivity typically varies according to the color of light. More specifically, light of the blue wavelength band may be perceived less sensitively by a user than light of a green wavelength band and light of a red wavelength band. Therefore, since the first color filter 331 includes a blue colorant, a user may perceive reflected light relatively less sensitively.

The first light shielding member 321 may be located on a surface of the second base 310 which faces the display substrate 10. The first light shielding member 321 may be located in the light shielding region PB to block transmission of light. The first light shielding member 321 may be in a substantially lattice shape in a plan view as illustrated in FIG. 4 and may surround each of the light outputting regions PA1 through PA6.

The first light shielding member 321 may include an organic light shielding material and may be formed through coating and exposure of the organic light shielding material.

As described above, external light may distort the color gamut of a color conversion panel. In an embodiment, the first light shielding member 321 is located on the second base 310, such that the distortion of color due to reflection of external light by absorbing at least a portion of the external light may be reduced. The first light shielding member 321 may effectively prevent color mixing due to intrusion of light between adjacent light outputting regions, thereby further improving the color gamut.

The second color filter 332 and the third color filter 333 may be disposed on the surface of the second base 310 which faces the display substrate 10.

The second color filter 332 may be disposed in the second light outputting region PA2 and the fifth light outputting region PA5. The second color filter 332 may be disposed continuously along the second direction D2 in the second light outputting region PA2 and the fifth light outputting region PA5. However, the disclosure is not limited thereto. Alternatively, the second color filter 332 located in the second light outputting region PA2 and the second color filter 332 located in the fifth light outputting region PA5 may also be spaced apart from each other along the second direction D2.

The third color filter 333 may be disposed in the third light outputting region PA3 and the sixth light outputting region PA6. The third color filter 333 may be disposed continuously along the second direction D2 in the third light outputting region PA3 and the sixth light outputting region PA6. However, the disclosure is not limited thereto. Alternatively, the third color filter 333 located in the third light outputting region PA3 and the third color filter 333 located in the sixth light outputting region PA6 may also be spaced apart from each other along the second direction D2.

The second color filter 332 may block or absorb light of the first color (e.g., blue light). In such an embodiment, the second color filter 332 may function as a blue light blocking filter that blocks blue light. In such an embodiment, the second color filter 332 may transmit only light of the second color (e.g., green light) and block or absorb light of the first color (e.g., blue light) and light of the third color (e.g., red light). In one embodiment, for example, the second color filter 332 may be a green color filter and may include a green colorant.

The third color filter 333 may block or absorb light of the first color (e.g., blue light). In such an embodiment, the third color filter 333 may function as a blue light blocking filter. In such an embodiment, the third color filter 333 may transmit only light of the third color (e.g., red light) and block or absorb light of the first color (e.g., blue light) and light of the second color (e.g., green light). In one embodiment, for example, the third color filter 333 may be a red color filter and may include a red colorant.

A first capping layer PS1 may be located on the surface of the second base 310 to cover the first light shielding member 321, the first color filter 331, the second color filter 332 and the third color filter 333. The first capping layer PS1 may directly contact the first color filter 331, the second color filter 332 and the third color filter 333. In such an embodiment, the first capping layer PS1 may contact the first light shielding member 321.

The first capping layer PS1 may effectively prevent impurities such as moisture or air from being introduced from the outside and damaging or contaminating the first light shielding member 321, the first color filter 331, the second color filter 332 and the third color filter 333. In such an embodiment, the first capping layer PS1 may effectively prevent the colorants contained in the first color filter 331, the second color filter 332 and the third color filter 333 from being diffused to other elements such as the first wavelength conversion pattern 342 and the second wavelength conversion pattern 343. In an embodiment, the first capping layer PS1 may include or be made of an inorganic material. In one embodiment, for example, the first capping layer PS1 may include or be made of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The light modulation pattern 340 may be disposed on the first capping layer PS1. The light modulation pattern 340 may include the light transmission pattern 341, the first wavelength conversion pattern 342, and the second wavelength conversion pattern 343.

The light transmission pattern 341 may be disposed in the first light outputting region PA1 and the fourth light outputting region PA4 and may not be disposed in other light outputting regions PA2, PA3, PA5 and PA6.

The light transmission pattern 341 may include a first base resin 3411 and a first scatterer 3413 dispersed in the first base resin 3411.

The first base resin 3411 may be a material having high light transmittance and high dispersion characteristics for the first scatterer 3413. In one embodiment, for example, the first base resin 3411 may include an organic material such as epoxy resin, acrylic resin, cardo resin, or imide resin.

The first scatterer 3413 may have a refractive index different from a refractive index of the first base resin 3411 and may form an optical interface with the first base resin 3411. In one embodiment, for example, the first scatterer 3413 may be light scattering particles. The first scatterer 3413 may be any material that can scatter at least a portion of transmitted light. In one embodiment, for example, the first scatterer 3413 may be metal oxide particles or organic particles. In such an embodiment, the metal oxide include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$). In such an embodiment, the organic particle material include acrylic resin and urethane resin. The first scatterer 3413 may scatter incident light in random directions regardless of the incident direction of the light without substantially changing the wavelength of the light transmitted through the light transmission pattern 341 such that the lateral visibility of the light transmitted through the light transmission pattern 341 may be improved.

The light L1 of the first color emitted from the first organic light emitting diode ED1 is transmitted to the outside through the light transmission pattern 341 and the first color filter 331. In such an embodiment, since light output from the first light outputting region PA1 and the fourth light outputting region PA4 is not wavelength-converted, the light output from the first light outputting region PA1 and the fourth light outputting region PA4 may be the light L1 of the first color having the same wavelength as the light L1 emitted from the first organic light emitting diode ED1.

The first wavelength conversion pattern 342 may be disposed in the second light outputting region PA2 and the fifth light outputting region PA5 and may not be disposed in other light outputting regions PA1, PA3, PA4 and PA6. The first wavelength conversion pattern 342 may convert a peak wavelength of incident light into another specific peak wavelength and output light having the converted peak wavelength. In one embodiment, for example, the first wavelength conversion pattern 342 may convert blue light into green light in the range of about 510 nm to about 550 nm and output the green light.

The first wavelength conversion pattern 342 may include a second base resin 3421 and a first wavelength conversion material 3422 dispersed in the second base resin 3421 and may further include a second scatterer 3423 dispersed in the second base resin 3421.

The second base resin 3421 may be a material having high light transmittance and high dispersion characteristics for the first wavelength conversion material 3422 and the second scatterer 3423. In one embodiment, for example, the second base resin 3421 may include an organic material such as epoxy resin, acrylic resin, cardo resin, or imide resin.

The first wavelength conversion material 3422 may convert a peak wavelength of incident light to another specific peak wavelength. In an embodiment, the first wavelength conversion material 3422 may include quantum dots, quantum rods, and phosphors. In one embodiment, for example, a quantum dot may be a particulate material that emits light of a specific color when an electron transits from a conduction band to a valence band.

The quantum dot may be a semiconductor nanocrystalline material. The quantum dot may have a specific band gap according to its composition and size. Thus, the quantum dot may absorb light and then emit light having a unique wavelength. In an embodiment, a semiconductor nanocrystal of the quantum dot include a group IV nanocrystal, a group II-VI compound nanocrystal, a group III-V compound nanocrystal a group IV-VI nanocrystal, and a combinations thereof.

In an embodiment, the group IV nanocrystal may be, but is not limited to, silicon (Si), germanium (Ge), or a binary compound such as silicon carbide (SiC) or silicon germanium (SiGe).

In an embodiment, the group II-VI compound nanocrystal may be, but is not limited to, a binary compound such as CdSe, CdTe, ZnS, ZnSe, ZnTe, ZnO, HgS, HgSe, HgTe, MgSe, MgS or a combination of the same, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS or a combination of the same, or a quaternary compound such as HgZnTeS, CdZnSeS, CdZnSeTe, CdZnSTe, CdHgSeS, CdHgSeTe, CdHgSTe, HgZnSeS, HgZnSeTe, HgZnSTe or a combination thereof.

In an embodiment, the group III-V compound nanocrystal may be, but is not limited to, a binary compound such as GaN, GaP, GaAs, GaSb, AlN, AlP, AlAs, AlSb, InN, InP, InAs, InSb or a combination of the same, a ternary compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP or a combination of the same, or a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb or a combination of the same.

In an embodiment, the group IV-VI nanocrystal may be, but is not limited to, a binary compound such as SnS, SnSe, SnTe, PbS, PbSe, PbTe or a combination of the same, a ternary compound such as SnSeS, SnSeTe, SnSTe, PbSeS, PbSeTe, PbSTe, SnPbS, SnPbSe, SnPbTe or a combination of the same, or a quaternary compound such as SnPbSSe, SnPbSeTe, SnPbSTe or a combination thereof.

The quantum dot may be in a form generally used in the art to which the disclosure pertains and is not limited to a particular form. In one embodiment, for example, the quantum dot may be in the form of a spherical, pyramidal, multi-arm, or cubic nanoparticle, nanotube, nanowire, nanofiber, plate-like nanoparticle, or the like. The above-described binary, ternary or quaternary compound may be present in a particle at a uniform concentration or may be present in a same particle at partially different concentrations.

The quantum dot may have a core-shell structure including a core containing the above-described nanocrystal and a shell surrounding the core. An interface between the core and the shell may have a concentration gradient in which the concentration of an element in the shell is reduced toward the center. The shell of the quantum dot may serve as a protective layer for maintaining semiconductor characteristics by preventing chemical denaturation of the core and/or as a charging layer for giving electrophoretic characteristics to the quantum dot. The shell may be a single layer or a multilayer. The shell of the quantum dot may be, for example, a metal or non-metal oxide, a semiconductor compound, or a combination of the same.

In one embodiment, for example, the metal or non-metal oxide may be, but is not limited to, a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$ or $NiO$ or a ternary compound such as $MgAl_2O_4$, $CoFe_2O_4$, $NiFe_2O_4$ or $CoMn_2O_4$.

In an embodiment, the semiconductor compound may be, but is not limited to, CdS, CdSe, CdTe, ZnS, ZnSe, ZnTe, ZnSeS, GaAs, GaP, GaSb, HgS, HgSe, HgTe, InAs, InSb, AlAs, AlP, or AlSb.

In an embodiment, light emitted from the first wavelength conversion material 3422 may have a full width at half maximum ("FWHM") of about 45 nm or less, about 40 nm or less, or about 30 nm or less. Therefore, the color purity and color reproducibility of the display device 1 may be improved. In such an embodiment, the light emitted from the first wavelength conversion material 3422 may be radiated in various directions regardless of the incident direction of incident light. Therefore, the lateral visibility of the display device 1 may be improved.

A portion of the light L1 of the first color emitted from the second organic light emitting diode ED2 may not be converted into green light by the first wavelength conversion material 3422. A component incident on the second color filter 332 without being converted by the first wavelength conversion pattern 342 may be blocked by the second color filter 332, and green light output from the first wavelength conversion pattern 342 may be transmitted to the outside through the second color filter 332. Accordingly, light output from the second light outputting region PA2 and the fifth light outputting region PA5 may be light L2 of the second color, for example, green light.

The second scatterer 3423 may have a refractive index different from a refractive index of the second base resin 3421 and form an optical interface with the second base resin 3421. In an embodiment, the second scatterer 3423 may be light scattering particles. The second scatterer 3423 may be a material that may scatter at least a portion of transmitted light. In one embodiment, for example, the second scatterer 3423 may be metal oxide particles or organic particles. In an embodiment, the metal oxide include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$). In an embodiment, the organic particle material include acrylic resin and urethane resin. The second scatterer 3423 may scatter incident light in random directions regardless of the incident direction of the light without substantially changing the wavelength of the light transmitted through the first wavelength conversion pattern 342. Accordingly, the length of the path of the light transmitted through the first wavelength conversion pattern 342 may be increased such that the color conversion efficiency of the first wavelength conversion material 3422 may be increased.

The thickness of the first wavelength conversion pattern 342 may be in a range of about 3 micrometers (μm) to about 15 μm. In an embodiment, where the first wavelength conversion pattern 342 is formed to have a thickness of about 3 μm or more, the color conversion efficiency of light transmitted through the first wavelength conversion pattern 342 may be improved. An upper limit of the thickness of the first wavelength conversion pattern 342 may be about 15 μm in view of ease of process.

The content of the first wavelength conversion material 3422 in the first wavelength conversion pattern 342 may be in a range of about 10% to about 60%, and the content of the second scatterer 3423 in the first wavelength conversion pattern 342 may be in a range of about 2% to about 15%.

The second wavelength conversion pattern 343 may be disposed in the third light outputting region PA3 and the sixth light outputting region PA6 and may not be disposed in other light outputting regions PA1, PA2, PA4 and PA5.

The second wavelength conversion pattern 343 may convert a peak wavelength of incident light into another specific peak wavelength and output light having the specific peak wavelength. In one embodiment, for example, the second wavelength conversion pattern 343 may convert blue light into red light in the range of about 610 nm to about 650 nm and output the red light.

The second wavelength conversion pattern 343 may include a third base resin 3431 and a second wavelength conversion material 3432 dispersed in the third base resin 3431 and may further include a third scatterer 3433 dispersed in the third base resin 3431.

The third base resin 3431 may be any material having high light transmittance and superior dispersion characteristics for the second wavelength conversion material 3432 and the third scatterer 3433. In one embodiment, for example, the third base resin 3431 may include an organic material such as epoxy resin, acrylic resin, cardo resin, or imide resin.

The second wavelength conversion material 3432 may convert a peak wavelength of incident light into another specific peak wavelength as described above. In one embodiment, for example, the second wavelength conversion material 3432 may convert blue light having a peak wavelength in the range of 430 nm to 470 nm into red light in the range of about 610 nm to about 650 nm and output the red light.

In an embodiment, the second wavelength conversion material 3432 may include quantum dots, quantum rods, and phosphors. The second wavelength conversion material 3432 is substantially the same as or similar to the first wavelength conversion material 3422 described above, and thus any repetitive detailed description thereof will omitted.

The first wavelength conversion material 3422 and the second wavelength conversion material 3432 may all be composed of quantum dots. In such an embodiment, the diameter of quantum dots constituting the first wavelength conversion material 3422 may be greater than that of quantum dots constituting the second wavelength conversion material 3432. In one embodiment, for example, the quantum dot size of the first wavelength conversion material 3422 may be about 40 angstroms (Å) to about 50 Å. In addition, the quantum dot size of the second wavelength conversion material 3432 may be in a range of about 55 Å to about 65 Å.

Light passed through the first wavelength conversion pattern 342 and the second wavelength conversion pattern 343 may be in an unpolarized state through depolarization. As used herein, 'unpolarized light' refers to light that is not composed only of polarization components in a specific direction, that is, light that is not polarized only in a specific direction or light that is composed of random polarization components.

The third scatterer 3433 may have a refractive index different from a refractive index of the third base resin 3431 and form an optical interface with the third base resin 3431. In one embodiment, for example, the third scatterer 3433 may be light scattering particles. Other features of the third scatterer 3433 are substantially the same as or similar to those of the first scatterer 3413 and the second scatterer 3423, and thus any repetitive detailed description thereof will be omitted.

The thickness of the second wavelength conversion pattern 343 may be in a range of 3 μm to 15 μm. In an embodiment, where the second wavelength conversion pattern 343 is formed to have a thickness of 3 μm or more, the color conversion efficiency of light transmitted through the second wavelength conversion pattern 343 may be improved. An upper limit of the thickness of the second wavelength conversion pattern 343 may be about 15 μm in view of ease of process.

The content of the second wavelength conversion material 3432 in the second wavelength conversion pattern 343 may be in a range of about 10% to about 60%, and the content of the third scatterer 3433 in the second wavelength conversion pattern 343 may be in a range of about 2% to about 15%.

A portion of the light L1 of the first color emitted from the third organic light emitting diode ED3 may not be converted into red light by the second wavelength conversion material 3432 and may be blocked by the third color filter 333. In such an embodiment, a portion of the light L1 of the first color emitted from the third organic light emitting diode ED3, which is converted into red light by the second wavelength conversion pattern 343, may be transmitted to the outside through the third color filter 333. Accordingly, light output from the third light outputting region PA3 and the sixth light outputting region PA6 may be light L3 of the third color, for example, red light.

The areas of the light transmission pattern 341, the first wavelength conversion pattern 342 and the second wavelength conversion pattern 343 may be different from each other to correspond to the light outputting regions PA1 through PA6, respectively, but not being limited thereto. Alternative, the areas of the light transmission pattern 341, the first wavelength conversion pattern 342 and the second wavelength conversion pattern 343 may be the same as each other.

The light modulation pattern 340 may protrude in a thickness direction or the third direction DR3. In an embodiment, the light modulation pattern 340 may protrude in a direction toward the display substrate 10. The light transmission pattern 341, the first wavelength conversion pattern 342 and the second wavelength conversion pattern 343 may be disposed substantially at a same height or level from the first base 110. However, the disclosure is not limited thereto, and alternatively, the light transmission pattern 341, the first wavelength conversion pattern 342 and the second wavelength conversion pattern 343 may be disposed at different heights from the first base 110, or two of the light transmission pattern 341, the first wavelength conversion pattern 342 and the second wavelength conversion pattern 343 may be disposed at a same height as each other from the first base 110, but the other one of the light transmission pattern 341, the first wavelength conversion pattern 342 and the second wavelength conversion pattern 343 may be disposed at a different height from the two thereof from the first base 110.

The openings OP1 through OP3 may be defined through the light modulation pattern 340 to overlap the light shielding region PB. In an embodiment, the first opening OP1 may be defined in the first light shielding region PB1 located between the first light outputting region PA1 and the fourth light outputting region PA4. In such an embodiment, the second opening OP2 may be defined in the second light shielding region PB2 located between the second light outputting region PA2 and the fifth light outputting region PA5. In such an embodiment, the third opening OP3 may be defined in the third light shielding region PB3 located between the third light outputting region PA3 and the sixth light outputting region PA6. Each of the openings OP1 through OP3 will be described in greater detail later with reference to FIGS. 6 and 7.

Although not illustrated in the drawings, a low refractive layer may be further disposed between the first capping layer PS1 and the light modulation pattern 340. The low refractive layer may be disposed entirely on the second base 310. The low refractive layer may have a refractive index lower than a refractive index of the light modulation pattern 340. In one embodiment, for example, a difference in refractive index between the light modulation pattern 340 and the low refractive layer may be about 0.3 or more. The low refractive layer may include a base resin and particles dispersed in the base resin. The particles included in the low refractive layer may be at least one of zinc oxide (ZnO) particles, titanium dioxide ($TiO_2$) particles, hollow silica particles, non-hollow silica particles, nano silicate particles, and porogen particles.

The low refractive layer may reflect a portion of light, which is emitted from the light modulation pattern 340 toward the second base 310, back to the light modulation pattern 340. Accordingly, the low refractive layer may improve light utilization efficiency and optical efficiency of the display device 1 by recycling at least a portion of light emitted toward the second base 310.

A second capping layer PS2 may be disposed on the light modulation pattern 340. The second capping layer PS2 may entirely cover the light transmission pattern 341, the first wavelength conversion pattern 342 and the second wavelength conversion pattern 343. However, the disclosure is not limited thereto, and alternatively, the second capping layer PS2 may cover only the first wavelength conversion pattern 342 and the second wavelength conversion pattern 343.

The second capping layer PS2 may seal the light modulation pattern 340 together with the first capping layer PS1, thereby effectively preventing impurities such as moisture or air from being introduced from the outside and damaging or contaminating the light transmission pattern 341. In an embodiment, the second capping layer PS2 may include or be made of an inorganic material. The second capping layer PS2 may include or be made of the same material as the first capping layer PS1 or may include at least one of the materials of the first capping layer PS1 described above.

Although not illustrated in the drawings, a filter layer may be further disposed on the light modulation pattern 340. The filter layer may be a reflective filter that transmits light having a specific wavelength region and reflects light having other specific wavelength regions. In one embodiment, for example, the filter layer may transmit blue light and reflect red light and green light.

The filter layer may improve light output efficiency by recycling red light and green light, which are emitted from the wavelength conversion patterns 342 and 343 toward the display substrate 10, back toward the second base 310. In such an embodiment, the filter layer may transmit the light L1 of the first color emitted from the organic light emitting diodes ED1 through ED3, but reflect light whose central wavelength is longer than that of the light L1 of the first color, thereby improving the color purity of the light L1 of the first color, i.e., blue light emitted from each of the organic light emitting diodes ED1 through ED3.

The second light shielding member 322 may be located on the second capping layer PS2. The second light shielding member 322 may be located in the light shielding region PB to block transmission of light. In an embodiment, the second light shielding member 322 may be located between the light transmission pattern 341 and the first wavelength conversion pattern 342 and between the first wavelength conversion pattern 342 and the second wavelength conversion pattern 343 to prevent color mixing between neighboring light outputting regions. The second light shielding member 322 may be in a stripe shape extending along the second direction D2.

The second light shielding member 322 may include an organic light shielding material and may be formed through coating and exposure of the organic light shielding material.

The filler 70 may be located in a space between the color conversion substrate 30 and the display substrate 10 as described above. The filler 70 may be located between the second capping layer PS2 and the thin-film encapsulation layer 170 and between the second light shielding member 322 and the thin-film encapsulation layer 170. The filler 70 may directly contact the second capping layer PS2 and the second light shielding member 322.

In an embodiment, as described above, the openings OP1 through OP3 is defined through the light modulation pattern 340 to overlap the light shielding region PB. The openings OP1 through OP3 of the light modulation pattern 340 will now be described in greater detail with reference to FIGS. 6 and 7.

Figure 6:
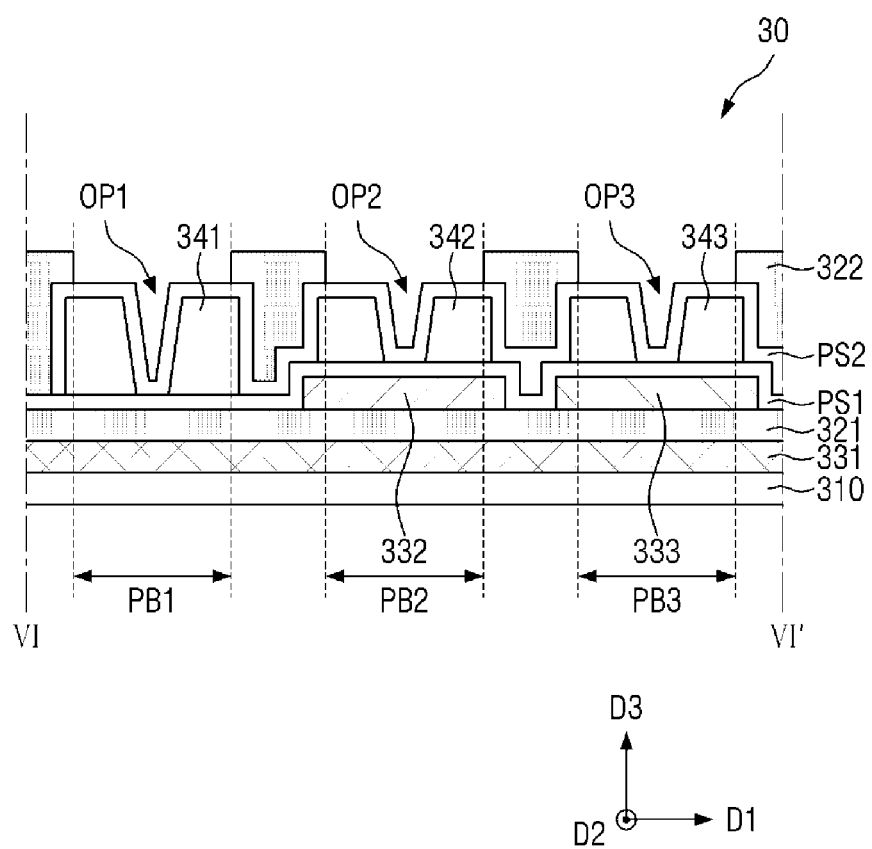
FIG. 6 is a cross-sectional view of an embodiment of the color conversion substrate, taken along line VI-VI' of FIG. 4.
Figure 7:
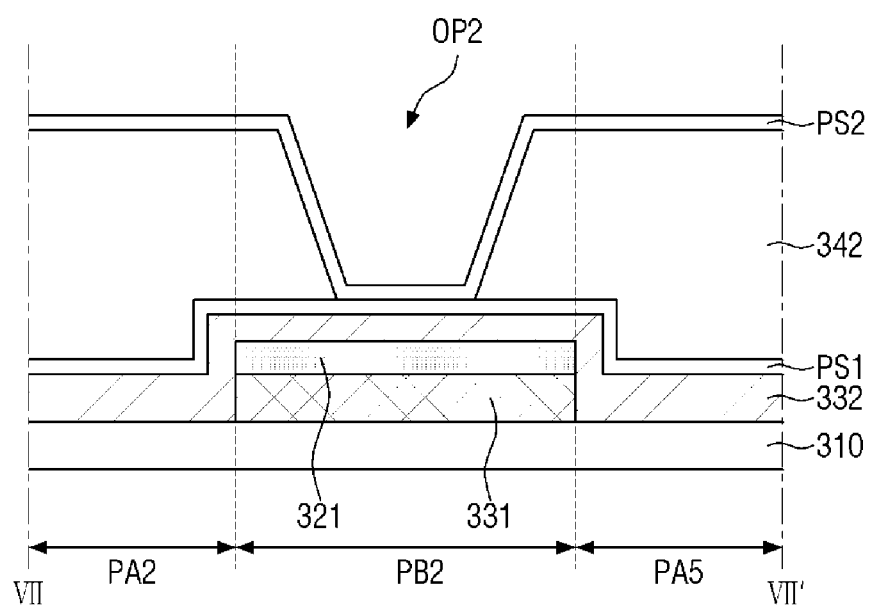
FIG. 7 is a cross-sectional view of an embodiment of the color conversion substrate, taken along line VII-VII' of FIG. 4.
Figure 8:
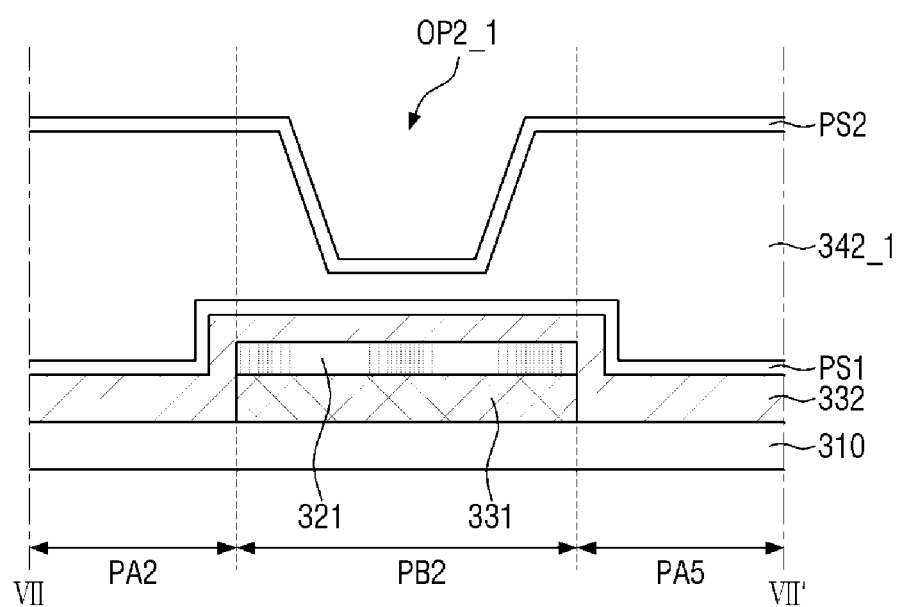
FIG. 8 is a cross section view of an alternative embodiment of the color conversion substrate corresponding to the cross-sectional view of FIG. 7.
Figure 8:
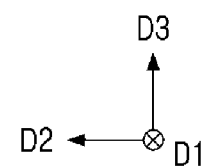

FIG. 6 is a cross-sectional view of an embodiment of the color conversion substrate 30, taken along line VI-VI' of FIG. 4. FIG. 7 is a cross-sectional view of an embodiment of the color conversion substrate 30, taken along line VII-VII' of FIG. 4. FIG. 8 is a cross section view of an alternative embodiment of the color conversion substrate corresponding to the cross-sectional view of FIG. 7. FIGS. 6 through 8 illustrate only the color conversion substrate 30, in which the light modulation pattern 340 faces upward.

Referring to FIGS. 6 and 7 in addition to FIGS. 4 and 5, a plurality of openings OP1 through OP3 is defined in the light modulation pattern 340. In an embodiment, the first opening OP1 may be defined in the light modulation pattern 340, the second opening OP2 is defined in the first wavelength conversion pattern 342, and include the third opening OP3 may be defined in the second wavelength conversion pattern 343.

The first opening OP1 may be defined or formed in the light transmission pattern 341 to expose at least a portion of the first capping layer PS1. The first opening OP1 may be defined or formed to overlap the light shielding region PB in a plan view. Specifically, the first opening OP1 may be defined or formed in the first light shielding region PB1 between the first light outputting region PA1 and the fourth light outputting region PA4.

The gas remaining inside the light transmission pattern 341 in the process of forming the light transmission pattern 341 can be effectively discharged through the first opening OP1.

In a case, where the light transmission pattern 341 includes or is formed of an organic material, if a bake process is not performed sufficiently, an uncured solvent component may remain inside the light transmission pattern 341. The uncured solvent may cause a gas to be generated inside the light transmission pattern 341, and the gas inside the light transmission pattern 341 may form an empty space in the light transmission pattern 341. The empty space may cause underfilling of the color conversion substrate 30. The empty space may form optical interfaces with the first base resin 3411 and the first capping layer PS1 because the empty space has a refractive index different from those of the first base resin 3411 and the first capping layer PS1 and may be seen differently from a region where the empty space is not formed.

In an embodiment, the first opening OP1 may be defined or formed in a certain region of the light transmission pattern 341 to expose the first capping layer PS1. The first opening OP1 may serve as a passage through which the gas inside the light transmission pattern 341 is discharged to the outside in a bake process. In such an embodiment, where the first opening OP1 is formed, a larger amount of gas may be discharged even when a bake process is performed for a same time, as compared with a case where the first opening OP1 is not defined or formed. Accordingly, in such an embodiment, a defect rate due to the gas remaining inside the light transmission pattern 341 may be reduced.

In such an embodiment, where the first opening OP1 is defined or formed to overlap the light shielding region PB, the first opening OP1 does not overlap the first light outputting region PA1 and the fourth light outputting region PA4. Therefore, the first opening OP1 may improve the reliability of the display device 1 without changing luminance characteristics of light transmitted through the color conversion substrate 30.

The second opening OP2 may be defined or formed in the first wavelength conversion pattern 342 to expose at least a portion of the first capping layer PS1. The second opening OP2 may be defined or formed to overlap the light shielding region PB in a plan view. In an embodiment, the second opening OP2 may be defined or formed in the second light shielding region PB2 between the second light outputting region PA2 and the fifth light outputting region PA5.

The gas remaining inside the first wavelength conversion pattern 342 in the process of forming the first wavelength conversion pattern 342 may be discharged through the second opening OP2.

The third opening OP3 may be defined or formed in the second wavelength conversion pattern 343 to expose at least a portion of the first capping layer PS1. The third opening OP3 may be defined or formed to overlap the light shielding region PB in a plan view. In an embodiment, the third opening OP3 may be defined or formed in the third light shielding region PB3 between the third light outputting region PA3 and the sixth light outputting region PA6.

The gas remaining inside the second wavelength conversion pattern 343 in the process of forming the second wavelength conversion pattern 343 may be discharged through the third opening OP3.

Other features of the second opening OP2 and the third opening OP3 are the same as those of the first opening OP1 described above, and thus any repetitive detailed description thereof will be omitted.

In an embodiment, as described above, the second capping layer PS2 may cover the entire surface of the light transmission pattern 341, the first wavelength conversion pattern 342, and the second wavelength conversion pattern 343. In such an embodiment, at least a portion of the second capping layer PS2 may contact the first capping layer PS1 exposed through each of the openings OP1 through OP3.

In an embodiment, as shown in FIGS. 6 and 7, each of the openings OP1 through OP3 is defined or formed in the light modulation pattern 340 to expose the first capping layer PS1, but not being limited thereto. Alternatively, as shown in FIG. 8, each of the openings OP1 through OP3 may be defined or formed partially through the light transmission pattern 341 not to expose the first capping layer PS1.

FIG. 8 is a cross-sectional view corresponding to the cross-sectional view of FIG. 7 and is a cross-sectional view specifically illustrating a second opening OP2_1. In such an embodiment, although not shown in FIG. 8, a first opening OP1 and a third opening OP3 may have a substantially same structure as the second opening OP2_1, and any repetitive detailed description of the first opening OP1 and the third opening OP3 will be omitted for ease of description.

In an embodiment, where the second opening OP2_1 does not expose a first capping layer PS1 as illustrated in FIG. 8, the first capping layer PS1 and a second capping layer PS2 may not contact each other in a second light shielding region PB2. In such an embodiment, at least a portion of a first wavelength conversion pattern 342_1 may be interposed between the first capping layer PS1 and the second capping layer PS2.

In such an embodiment, where the second opening OP2_1 is formed not to expose the first capping layer PS1, it is possible to prevent the first capping layer PS1 from being damaged in the process of forming the second opening OP2_1. Such features of the embodiment illustrated in FIG. 8 may also applicable to the structures of other embodiments to be described later.

Hereinafter, various alternative embodiments of the display device will be described. In the following embodiments, the same or like elements as those of the above-described embodiment will be indicated by the same reference numerals, and any repetitive detailed description thereof will be omitted or simplified. The following embodiments will be described, focusing mainly on differences from the above-described embodiment.

Figure 9:
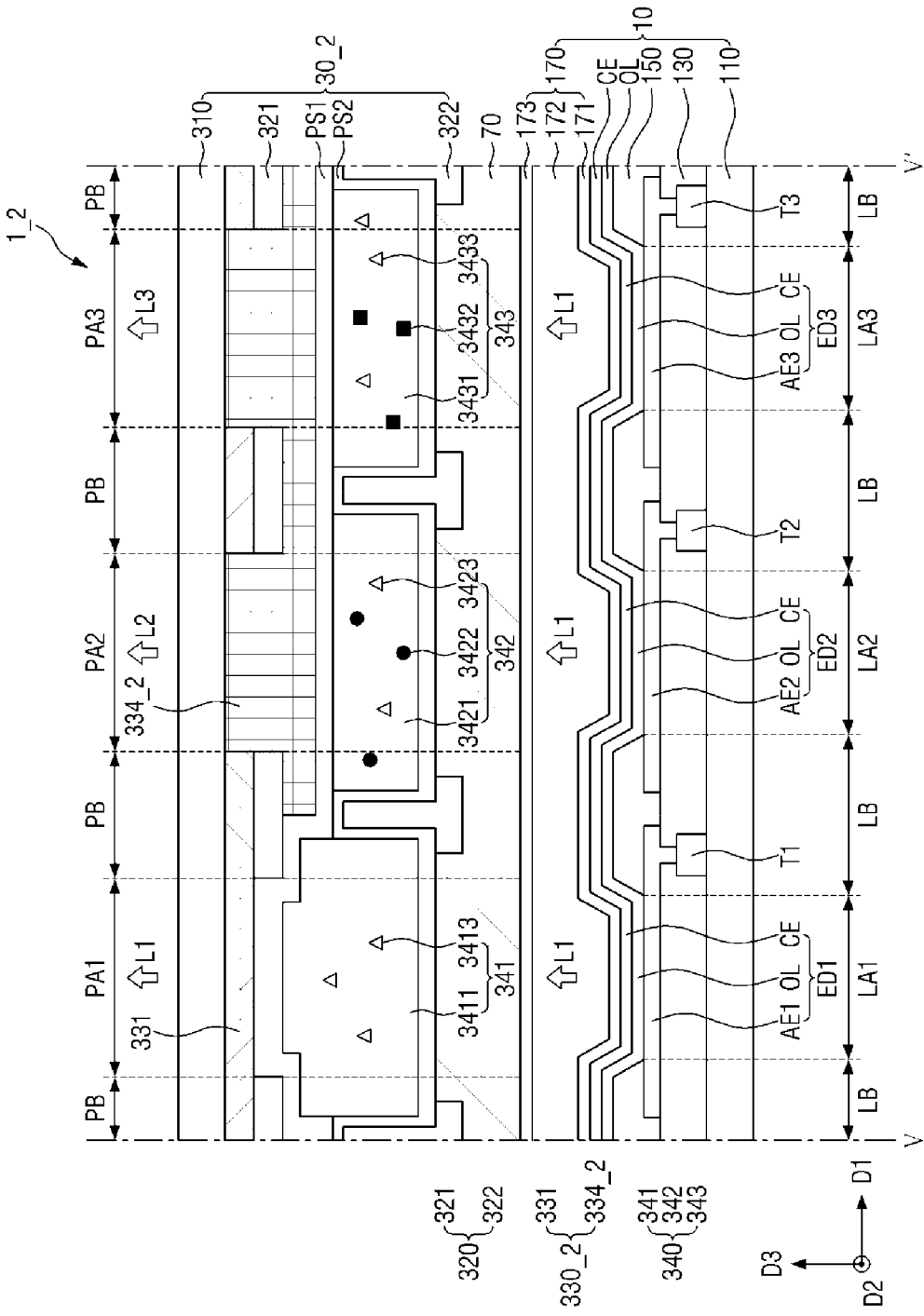
FIGS. 9 and 10 are cross-sectional views of alternative embodiments of the display device.
Figure 10:
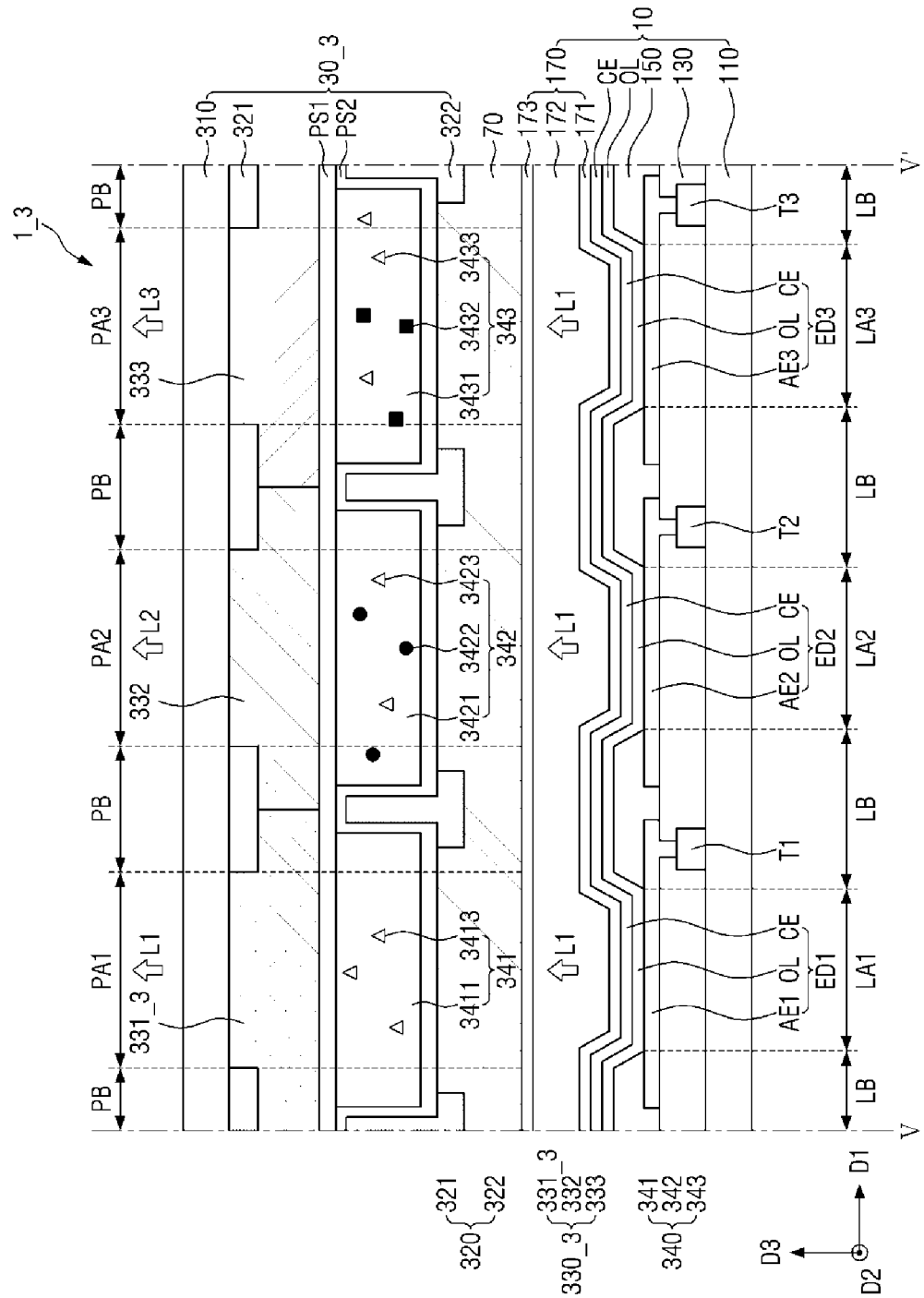

FIGS. 9 and 10 are cross-sectional views of alternative embodiments of the display device. FIGS. 9 and 10 are cross-sectional views corresponding to the cross-sectional view shown in FIG. 5.

An embodiment of the display device shown in FIG. 9 is the same as or similar to the embodiment of FIG. 5 except that a color conversion substrate 30_2 does not include a second color filter 332 and a third color filter 333 and includes a fourth color filter 334_2.

Referring to FIG. 9 in addition to FIGS. 4 and 5, an embodiment of the color conversion substrate 30_2 may include a second base 310, a color filter 330_2 disposed on a surface of the second base 310, and a first light shielding member 321. The color filter 330_2 may include a first color filter 331 and the fourth color filter 334_2.

The second base 310 may be disposed to face a display substrate 10, and the first color filter 331 may be disposed on the surface of the second base 310. The first color filter 331 may be disposed in a first light outputting region PA1 and a light shielding region PB around the first light outputting region PA1. The first light shielding member 321 may be disposed on a surface of the first color filter 331 and overlap the light shielding region PB between the light outputting regions PA.

The fourth color filter 334_2 may be disposed continuously along the first direction D1 in a second light outputting region PA2 and a third light outputting region PA3. The fourth color filter 334_2 may be disposed continuously along the second direction D2 in a fifth light outputting region PA5 and a sixth light outputting region PA6. In an embodiment, the fourth color filter 334_2 may cover the first color filter 331 and the first light shielding member 321 between the second light outputting region PA2 and the third light outputting region PA3.

In such an embodiment, the fourth color filter 334_2 may overlap a second light shielding region PB2 between the second light outputting region PA2 and the fifth light outputting region PA5 and a third light shielding region PB3 between the third light outputting region PA3 and the sixth light outputting region PA6.

The fourth color filter 334_2 may block or absorb light of a first color (e.g., blue light). In such an embodiment, the fourth color filter 334_2 may function as a blue light blocking filter. In such an embodiment, the fourth color filter 334_2 may transmit light of a second color (e.g., green light) and light of a third color (e.g., red light) and block or absorb light of the first color (e.g., blue light). In one embodiment, for example, the fourth color filter 334_2 may be a yellow color filter and may include a yellow colorant or may include a green colorant and a red colorant.

Other elements are the same as those described above, and thus any repetitive detailed description thereof will be omitted.

An embodiment of the display device shown in FIG. 10 is the same as or similar to the embodiment of FIG. 5 except that a first color filter 331_3 of a color conversion substrate 30_3 is disposed only in a first light outputting region PA1 and a fourth light outputting region PA4.

Referring to FIG. 10 in addition to FIGS. 4 and 5, an embodiment of the color conversion substrate 30_3 may include a second base 310, a first light shielding member 321 disposed on a surface of the second base 310, and a color filter 330_3. The color filter 330_3 may include the first color filter 331_3, a second color filter 332, and a third color filter 333.

The second base 310 may be disposed to face a display substrate 10, and the first light shielding member 321 may be disposed on the surface of the second base 310. The first light shielding member 321 may be disposed in a light shielding region PB between light outputting regions PA.

The first color filter 31_3, the second color filter 332, and the third color filter 333 may be disposed on the second base 310 and a surface of the first light shielding member 321. In an embodiment, the first color filter 331_3 may be disposed in the first light outputting region PA1 and the fourth light outputting region PA4 and may not be disposed in other light outputting regions PA2, PA3, PA5 and PA6. The second color filter 332 may be disposed in a second light outputting region PA2 and a fifth light outputting region PA5 and may not be disposed in other light outputting regions PA1, PA3, PA4 and PA6. The third color filter 333 may be disposed in a third light outputting region PA3 and a sixth light outputting region PA6 and may not be disposed in other light outputting regions PA1, PA2, PA4 and PA5.

The first color filter 331_3 may transmit only blue light and block or absorb green light and red light. In one embodiment, for example, the first color filter 331_3 may be a blue color filter and include a blue colorant such as a blue dye or a blue pigment.

The second color filter 332 may transmit only green light and block or absorb blue light and red light. In one embodiment, for example, the second color filter 332 may be a green color filter and include a green colorant.

The third color filter 333 may transmit only red light and block or absorb blue light and green light. In one embodiment, for example, the third color filter 333 may be a red color filter and include a red colorant.

In the light shielding region PB, an end of the first color filter 331_3 may contact an end of the second color filter 332, and the other end of the second color filter 332 may contact an end of the third color filter 333.

Each of the first color filter 331_3, the second color filter 332 and the third color filter 333 may have a substantially uniform thickness.

A first capping layer PS1 may entirely cover the color filter 330_3 and may be formed to have a substantially uniform thickness along the surface of the color filter 330_3.

Other elements are the same as those described above, and thus any repetitive detailed description thereof will be omitted.

Figure 11:
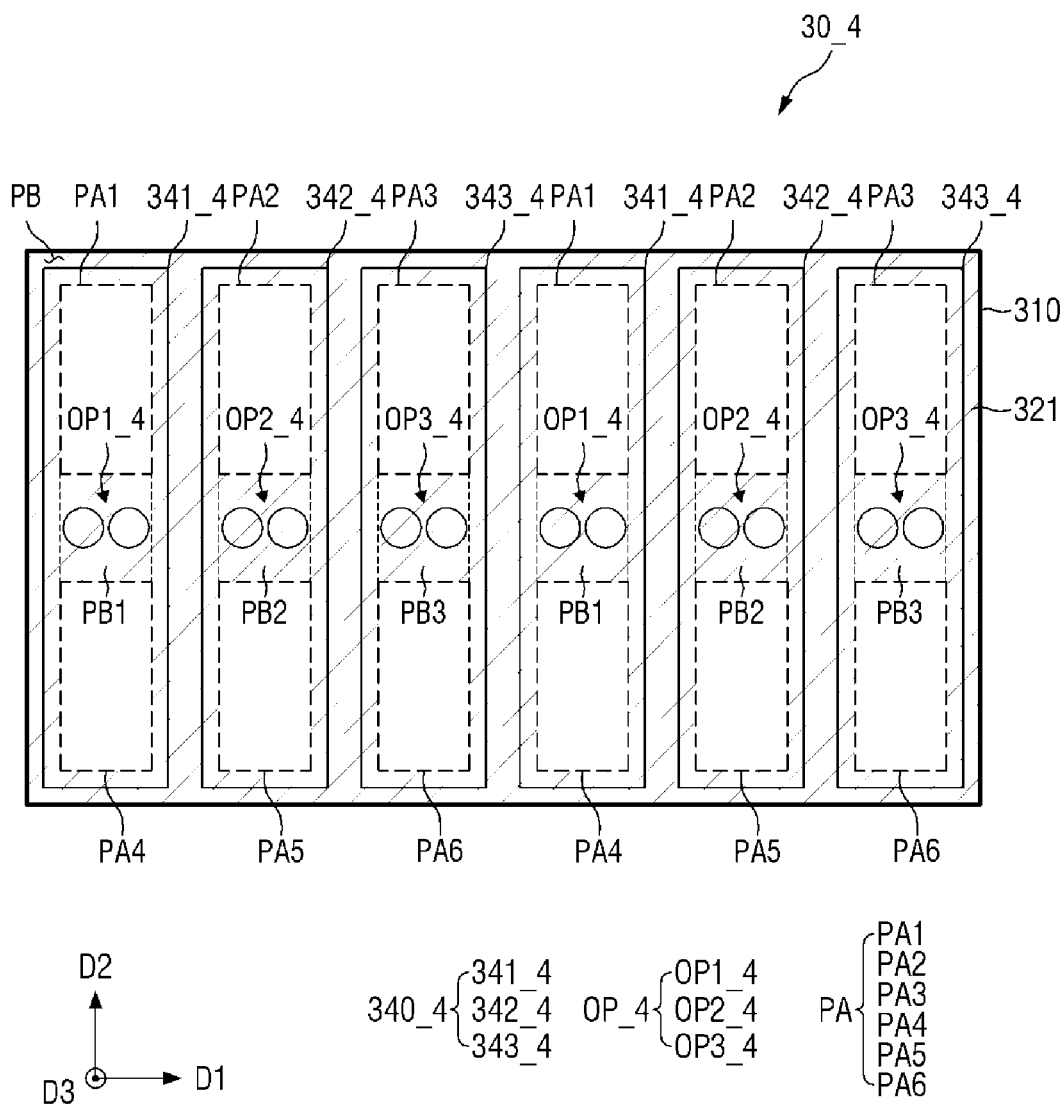
FIGS. 11 and 12 are schematic plan views of alternative embodiments of the color conversion substrate of the display device.
Figure 12:
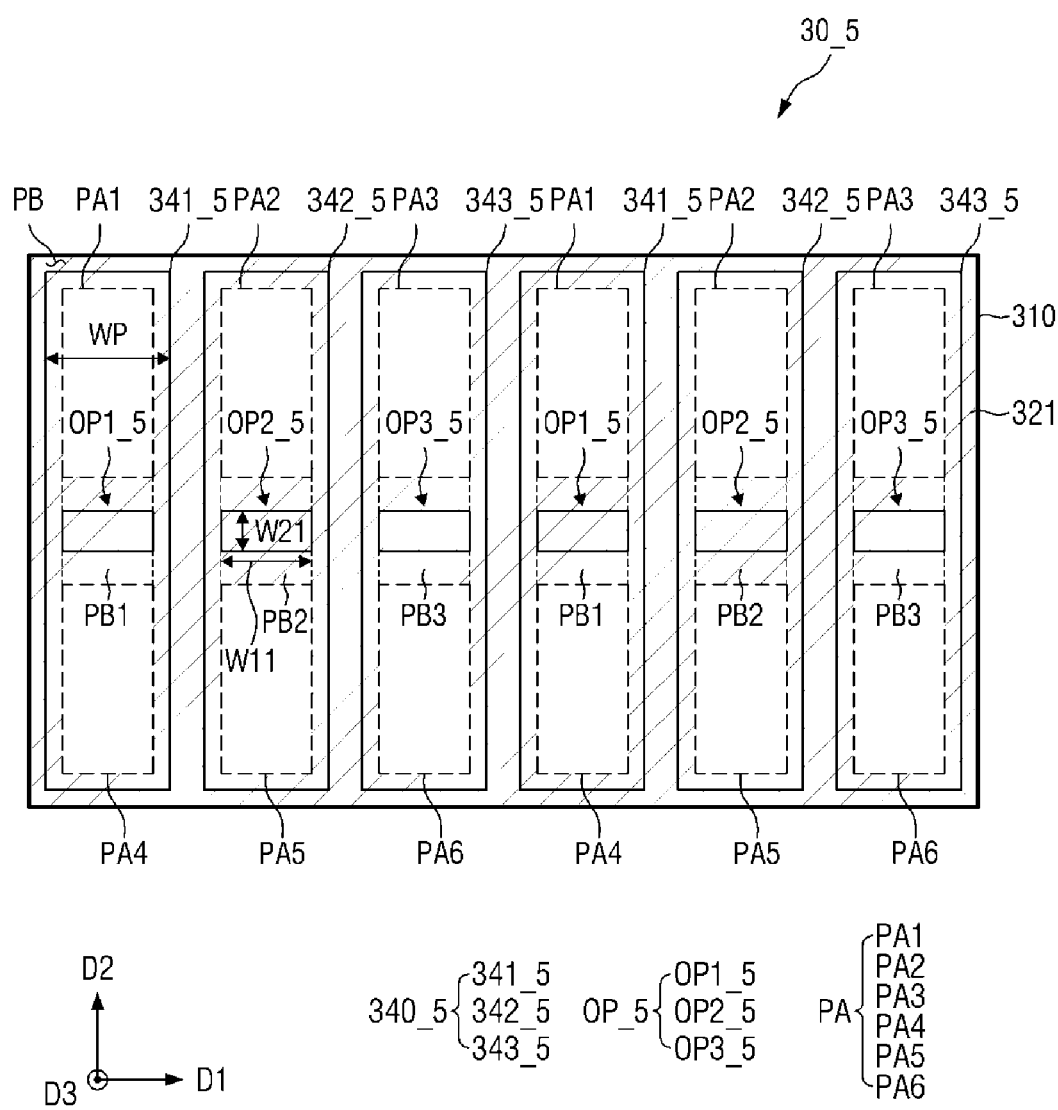

FIGS. 11 and 12 are schematic plan views of alternative embodiments of the color conversion substrate of the display device. Specifically, embodiments of the color conversion substrates shown in FIGS. 11 and 12 are substantially the same as or similar to the embodiment of FIG. 4 except for the configuration of the color conversion substrate 30, in particular, the openings OP1 through OP3 of the color conversion substrate 30. Therefore, any repetitive description of the same or like elements thereof will be omitted.

The color conversion substrate of FIG. 11 is different from the color conversion substrate of FIG. 4 in that a plurality of openings OP1_4, OP2_4 or OP3_4 are defined or formed in each light shielding region PB1, PB2 or PB3.

Referring to FIG. 11 in addition to FIG. 4, an embodiment of a color conversion substrate 30_4 includes a plurality of light outputting regions PA and a light shielding region PB surrounding each of the light outputting regions PA. In such an embodiment, the color conversion substrate 30_4 may include a light modulation pattern 340_4 overlapping each light outputting region PA. In such an embodiment, the light modulation pattern 340_4 may include a light transmission pattern 341_4 overlapping a first light outputting region PA1 and a fourth light outputting region PA4, a first wavelength conversion pattern 342_4 overlapping a second light outputting region PA2 and a fifth light outputting region PA5, and a second wavelength conversion pattern 343_4 overlapping a third light outputting region PA3 and a sixth light outputting region PA6.

The light transmission pattern 341_4, the first wavelength conversion pattern 342_4, and the second wavelength conversion pattern 343_4 may be disposed continuously along the second direction D2. In an embodiment, the light transmission pattern 341_4 may overlap a first light shielding region PB1 located between the first light outputting region PA1 and the fourth light outputting region PA4, the first wavelength conversion pattern 342_4 may overlap a second light shielding region PB2 located between the second light outputting region PA2 and the fifth light outputting region PA5, and the second wavelength conversion pattern 343_4 may overlap a third light shielding region PB3 located between the third light outputting region PA3 and the sixth light outputting region PA6.

In such an embodiment, a plurality of openings OP_4 overlapping the light shielding region PB is defined in the light modulation pattern 340_4. In such an embodiment, the openings OP_4 may overlap the light shielding region PB in the thickness direction of the light modulation pattern 340_4.

The openings OP_4 may include first openings OP1_4, second openings OP2_4, and third openings OP3_4. The first openings OP1_4 may overlap the first light shielding region PB1, the second openings OP2_4 may overlap the second light shielding region PB2, and the third openings OP3_4 may overlap the third light shielding region PB3.

In an embodiment, as shown in FIG. 4, a single opening OP1, OP2 or OP3 is defined in each of the first light shielding region PB1, the second light shielding region PB2 and the third light shielding region PB3. Alternatively, as shown in FIG. 11, a plurality of openings OP1_4, OP2_4 or OP3_4 is defined in each of the first light shielding region PB1, the second light shielding region PB2 and the third light shielding region PB3. In FIG. 11, two openings OP1_4, OP2_4 or OP3_4 are disposed in each of the light shielding regions PB1 through PB3, but not being limited thereto. Alternatively, more than two openings OP_4 may be defined in each of the light shielding regions PB1 through PB3.

The openings OP1_4 through OP3_4 respectively formed in the light shielding regions PB1 through PB3 may have a same size as each other. However, the disclosure is not limited thereto. Alternatively, the areas of the openings OP1_4 through OP3_4 in different light shielding regions PB1, PB2 and PB3 may be different from each other in a plan view. In such an embodiment, the areas of the openings OP1_4, OP2_4 or OP3_4 in a same light shielding region PB1, PB2 or PB3 may be different from each other.

In an embodiment, where a plurality of openings OP1_4, OP2_4 or OP3_4 are formed in each of the light shielding regions PB1, PB2 or PB3 as illustrated in FIG. 11, the area of the light modulation pattern 340_4 exposed to an outside may be increased. Therefore, the internal residual gas may be more effectively discharged.

The color conversion substrate of FIG. 12 is different from the color conversion substrate of FIG. 4 in that each opening OP1_5, OP2_5 or OP3_5 has a quadrilateral shape in a plan view.

Referring to FIG. 12 in addition to FIG. 4, an embodiment of a color conversion substrate 30_5 includes a plurality of light outputting regions PA and a light shielding region PB surrounding each of the light outputting regions PA. In addition, the color conversion substrate 30_5 may include a light modulation pattern 340_5 overlapping each light outputting region PA. In an embodiment, the light modulation pattern 340_5 may include a light transmission pattern 341_5 overlapping a first light outputting region PA1 and a fourth light outputting region PA4, a first wavelength conversion pattern 342_5 overlapping a second light outputting region PA2 and a fifth light outputting region PA5, and a second wavelength conversion pattern 343_5 overlapping a third light outputting region PA3 and a sixth light outputting region PA6.

In such an embodiment, a plurality of openings OP_5 overlapping the light shielding region PB may be defined in the light modulation pattern 340_5.

Each of the openings OP_5 may have a quadrilateral shape in a plan view or may have one of various shapes according to the shape of a region between the light outputting regions PA. In one embodiment, for example, a first opening OP1_5 may be shaped like a rectangle whose width W11 in the first direction D1 is greater than a width W21 in the second direction D2 in a plan view. In such an embodiment, the width W11 of the first opening OP1_5 in the first direction D1 may be smaller than a width WP of the light transmission pattern 341_5 in the first direction D1.

In such an embodiment, the shape of each opening OP_5 may be variously modified according to the area of the light shielding region PB between the light outputting regions PA in a way such that the area of the light modulation pattern 340_5 exposed to the outside is increased. Therefore, the internal residual gas may be effectively discharged.

FIGS. 13 through 18 are schematic plan and cross-sectional views of other alternative embodiments of the color conversion substrate of the display device. The embodiments shown in FIGS. 13 through 18 are different from the embodiment of FIGS. 4 and 5 in the openings OP of the color conversion substrate 30.

Figure 13:
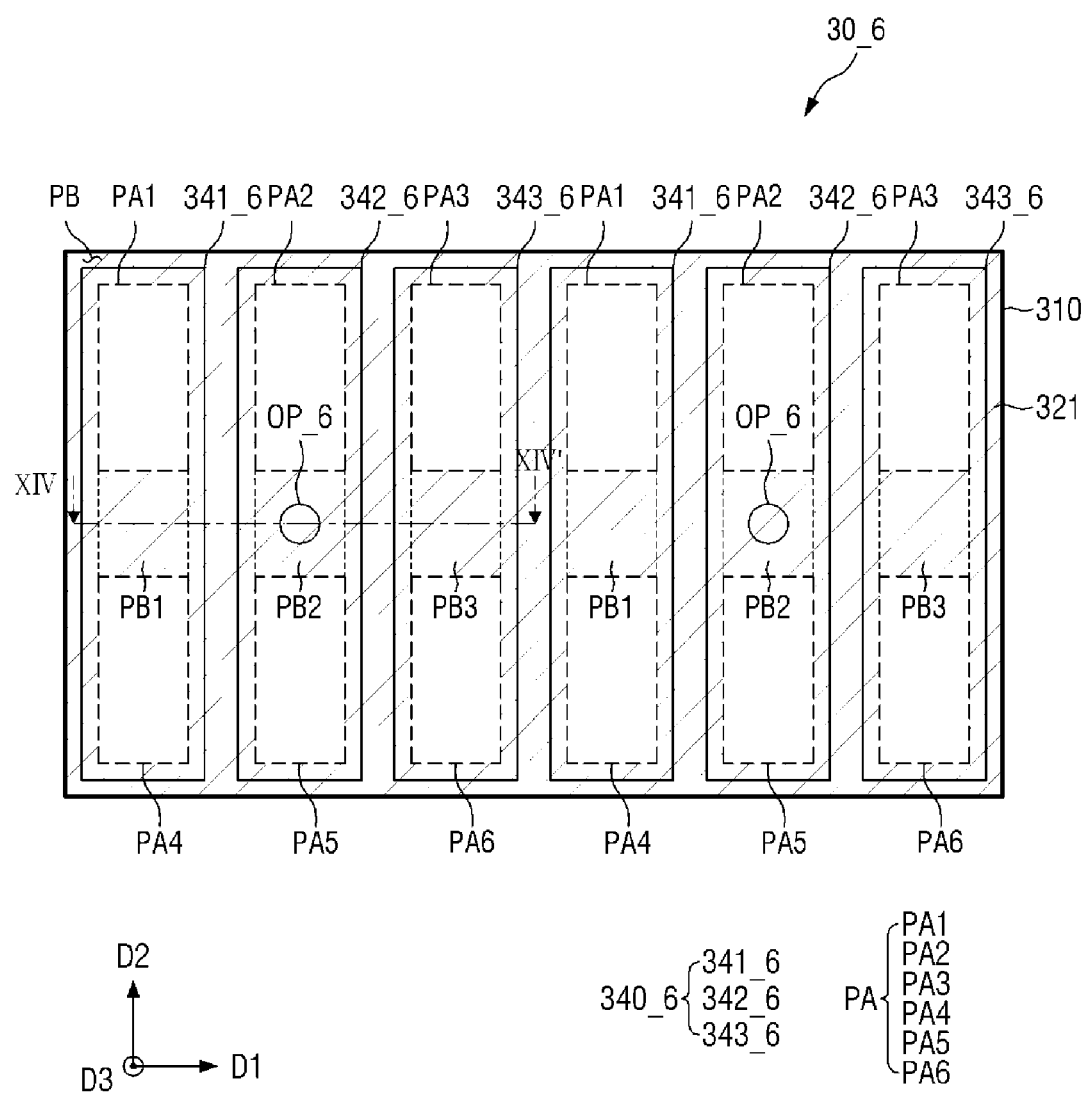
FIGS. 13 through 18 are schematic plan and cross-sectional views of other alternative embodiments of the color conversion substrate of the display devices.
Figure 14:
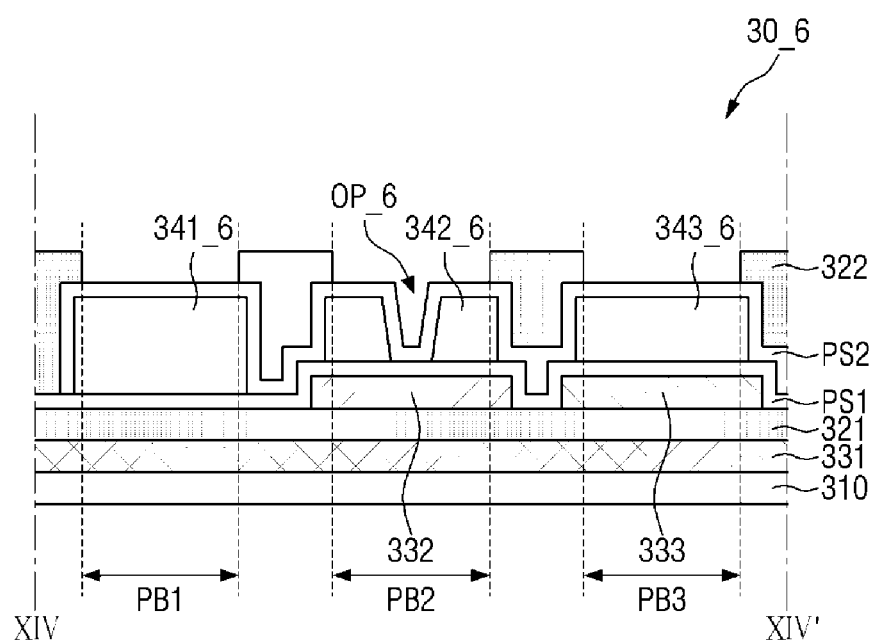

The color conversion substrate of FIGS. 13 and 14 is the same as or similar to the color conversion substrate of FIGS. 4 and 5 except that an opening OP_6 is formed only in a second light shielding region PB2. Therefore, any repetitive detailed description of the same or like elements will be omitted.

Referring to FIGS. 13 and 14 in addition to FIGS. 4 and 5, an embodiment of a color conversion substrate 30_6 includes a plurality of light outputting regions PA and a light shielding region PB surrounding each of the light outputting regions PA. In such an embodiment, the color conversion substrate 30_6 may include a light modulation pattern 340_6 overlapping each light outputting region PA. In such an embodiment, the opening OP_6 overlapping the light shielding region PB is defined in the light modulation pattern 340_6.

The light modulation pattern 340_6 may include a light transmission pattern 341_6, a first wavelength conversion pattern 342_6, and a second wavelength conversion pattern 343_6.

The light transmission pattern 341_6 may be disposed continuously along the second direction D2 in a first light outputting region PA1 and a fourth light outputting region PA4. The first wavelength conversion pattern 342_6 may be disposed continuously along the second direction D2 in a second light outputting region PA2 and a fifth light outputting region PA5. The second wavelength conversion pattern 343_6 may be disposed continuously along the second direction D2 in a third light outputting region PA3 and a sixth light outputting region PA6.

In such an embodiment, as described above, the opening OP_6 is defined in the light modulation pattern 340_6, and the opening OP_6 may be defined or formed only the second light shielding region PB2 overlapping the first wavelength conversion pattern 342_6. In a case where the gas remaining inside the light transmission pattern 341_6 and the second wavelength conversion pattern 343_6 is sufficiently removed, but the gas remaining inside the first wavelength conversion pattern 342_6 is not sufficiently removed, the opening OP_6 may be formed only in the first wavelength conversion pattern 342_6 to discharge the remaining gas.

Specifically, the gas remaining inside the light transmission pattern 341_6, the first wavelength conversion pattern 342_6, and the second wavelength conversion pattern 343_6 may differ depending on the formation order of each pattern. In one embodiment, for example, when the second wavelength conversion pattern 343_6 and the first wavelength conversion pattern 342_6 are sequentially formed after the light transmission pattern 341_6 is formed first, the first wavelength conversion pattern 342_6 formed last may go through only one bake process. Therefore, the gas inside the first wavelength conversion pattern 342_6 may not be sufficiently discharged. In such an embodiment, the gas remaining inside the first wavelength conversion pattern 342_6 may be discharged sufficiently by forming the opening OP_6 only in the first wavelength conversion pattern 342_6, which is formed last.

In an embodiment, as described above, the opening OP_6 may be formed only in the second light shielding region PB2, but not being limited thereto. Alternatively, the opening OP_6 may be formed only in a first light shielding region PB1 or may be formed in the third light shielding region PB3 depending on the gas remaining inside each pattern.

Figure 15:
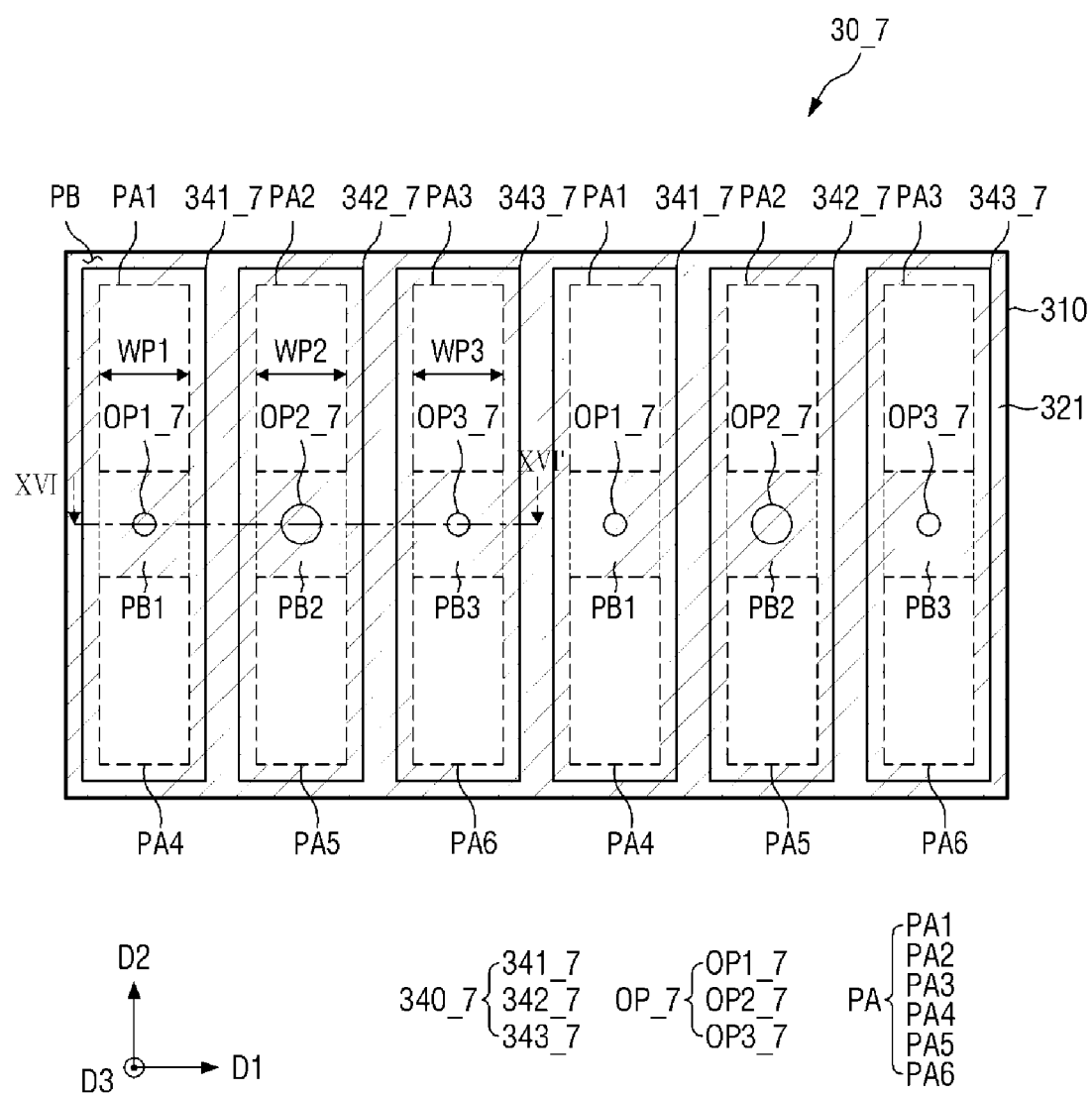
Figure 16:
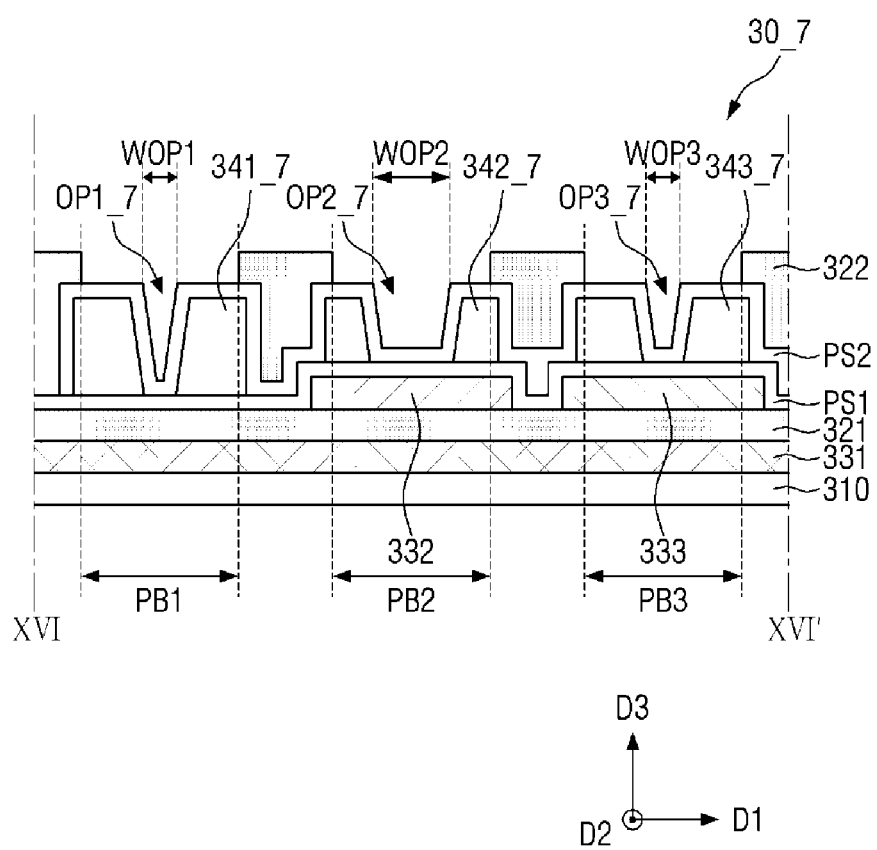

The color conversion substrate of FIGS. 15 and 16 is the same as or similar to the color conversion substrate of FIGS. 4 and 5 except that the area of a second opening OP2_7 formed in a second light shielding region PB2 is larger than the area of a first opening OP1_7 and the area of a third opening OP3_7 formed in a first light shielding region PB1 and a third light shielding region PB3. Therefore, any repetitive detailed description of the same or like elements will be omitted.

Referring to FIGS. 15 and 16 in addition to FIGS. 4 and 5, an embodiment of a color conversion substrate 30_7 includes a plurality of light outputting regions PA and a light shielding region PB surrounding each of the light outputting regions PA. In such an embodiment, the color conversion substrate 30_7 may include a light modulation pattern 340_7 overlapping each light outputting region PA.

The light modulation pattern 340_7 may include a light transmission pattern 341_7, a first wavelength conversion pattern 342_7, and a second wavelength conversion pattern 343_7. The light transmission pattern 341_7 may be disposed continuously along the second direction D2 in a first light outputting region PA1 and a fourth light outputting region PA4. The first wavelength conversion pattern 342_7 may be disposed continuously along the second direction D2 in a second light outputting region PA2 and a fifth light outputting region PA5. The second wavelength conversion pattern 343_7 may be disposed continuously along the second direction D2 in a third light outputting region PA3 and a sixth light outputting region PA6.

In such an embodiment, a plurality of openings OP_7 overlapping the light shielding region PB is defined in the light modulation pattern 340_7. In such an embodiment, the first opening OP1_7 may overlap the first light outputting region PB1 between the first light outputting region PA1 and the fourth light outputting region PA4. In such an embodiment, the second opening OP2_7 may overlap the second light shielding region PB2 between the second light outputting region PA2 and the fifth light outputting region PA5. In such an embodiment, the third opening OP3_7 may overlap the third light shielding region PB3 between the third light outputting region PA3 and the sixth light outputting region PA6.

The area of the second opening OP2_7 overlapping the second light shielding region PB2 may be larger than areas of the first opening OP1_7 and the third opening OP3_7. In one embodiment, for example, in cross section, a width WOP2 of the second opening OP2_7 may be greater than a width WOP1 of the first opening OP1_7 and a width WOP3 of the third opening OP3_7.

The number of the first openings OP1_7 defined in the first light shielding region PB1 and the number of the third openings OP3_7 defined in the third light shielding region PB3 may be equal to each other. In a case where the amount of gas remaining inside the second wavelength conversion pattern 343_7 is greater than the amount of gas remaining inside the light transmission pattern 341_7, the third opening OP3_7 may be formed to be larger in area than the first opening OP1_7.

In an embodiment, where the area of the second opening OP2_7 is larger than those of the first opening OP1_7 and the third opening OP3_7, the gas remaining inside the first wavelength conversion pattern 342_7 may be effectively discharged. In an embodiment, the first wavelength conversion pattern 342_7 may be formed last as described above, such that it may go through one bake process. Thus, more gas may remain in the first wavelength conversion pattern 342_7 than in the light transmission pattern 341_7 and the second wavelength conversion pattern 343_7. In such an embodiment, the second opening OP2_7 larger than the other openings may be formed in the first wavelength conversion pattern 342_7 to facilitate gas discharge.

Figure 17:
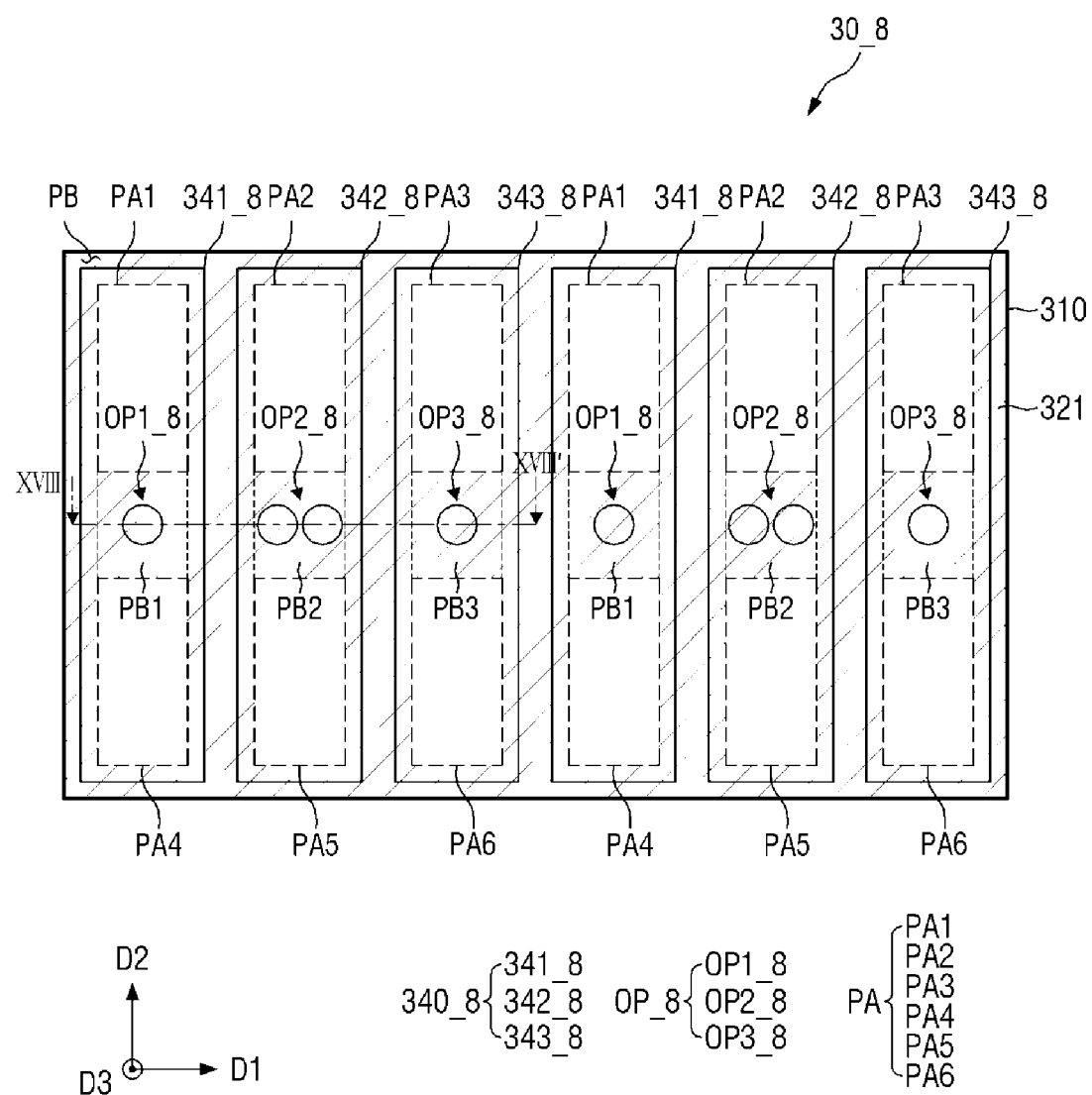
Figure 18:
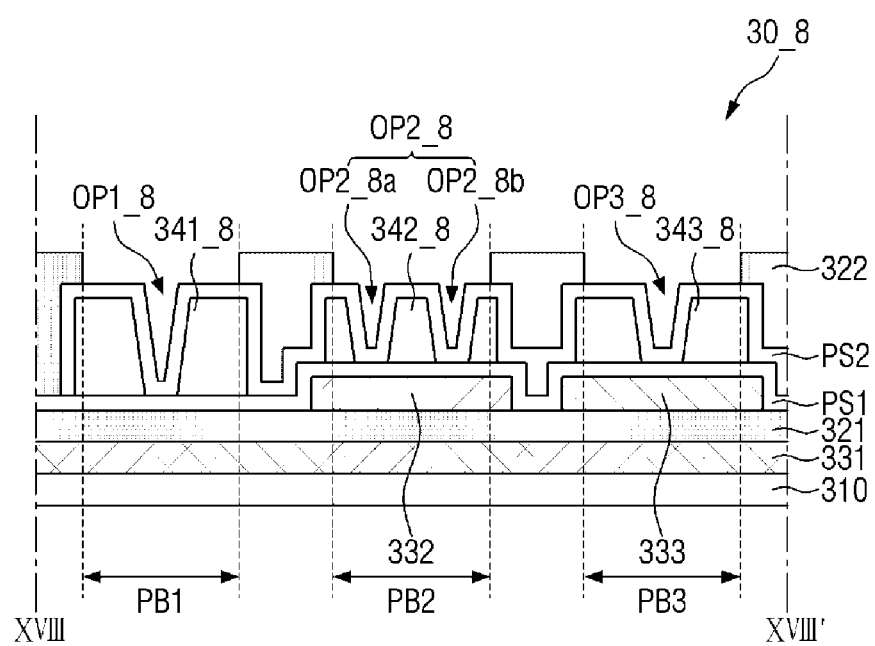

The color conversion substrate of FIGS. 17 and 18 is the same as or similar to the color conversion substrate of FIGS. 4 and 5 except that the number of second openings OP2_8 defined in a second light shielding region PB2 is greater than the number of first openings OP1_8 defined in a first light shielding region PB1 and the number of third openings OP3_8 defined in a third light shielding region PB3. Therefore, differences will be mainly described.

Referring to FIGS. 17 and 18 in addition to FIGS. 4 and 5, an embodiment of a color conversion substrate 30_8 includes a plurality of light outputting regions PA and a light shielding region PB surrounding each of the light outputting regions PA. In such an embodiment, the color conversion substrate 30_8 may include a light modulation pattern 340_8 overlapping each light outputting region PA. In such an embodiment, a plurality of openings OP_8 overlapping the light shielding region PB may be defined in the light modulation pattern 340_8.

The light modulation pattern 340_8 may include a light transmission pattern 341_8, a first wavelength conversion pattern 342_8, and a second wavelength conversion pattern 343_8.

The light transmission pattern 341_8 may be disposed continuously along the second direction D2 in a first light outputting region PA1 and a fourth light outputting region PA4. The first wavelength conversion pattern 342_8 may be disposed continuously along the second direction D2 in a second light outputting region PA2 and a fifth light outputting region PA5. The second wavelength conversion pattern 343_8 may be disposed continuously along the second direction D2 in a third light outputting region PA3 and a sixth light outputting region PA6.

The openings OP_8 may be defined in the light modulation pattern 340_8. In an embodiment, the first opening OP1_8 may overlap the first light shielding region PB1 between the first light outputting region PA1 and the fourth light outputting region PA4. In such an embodiment, the second opening OP2_8 may overlap the second light shielding region PB2 between the second light outputting region PA2 and the fifth light outputting region PA5. In such an embodiment, the third opening OP3_8 may overlap the third light shielding region PB3 between the third light outputting region PA3 and the sixth light outputting region PA6.

A greater number of the openings OP_8 may be defined in the second light shielding region PB2 than in the first light shielding region PB1 and the third light shielding region PB3. In such an embodiment, the number of the second openings OP2_8 defined in the second light shielding region PB2 may be greater than the number of the first openings OP1_8 and the number of the third openings OP3_8.

A plurality of second openings OP2_8a and OP2_8b defined in the second light shielding region PB2 may have a same area as each other or may have different areas from each other.

The number of the first openings OP1_8 defined in the first light shielding region PB1 and the number of the third openings OP3_8 defined in the third light shielding region PB3 may be equal to each other. In a case where the amount of gas remaining inside the second wavelength conversion pattern 343_8 is greater than the amount of gas remaining inside the light transmission pattern 341_8, the number of the third openings OP3_7 may be greater than the number of the first openings OP1_7.

When the number of the second openings OP2_8 is greater than the number of the first openings OP1_8 and the number of the third openings OP3_8, the gas remaining inside the first wavelength conversion pattern 342_8 may be effectively discharged. In an embodiment, the first wavelength conversion pattern 342_8 may be formed last as described above, such that it may go through one bake process. Thus, more gas may remain in the first wavelength conversion pattern 342_8 than in the light transmission pattern 341_8 and the second wavelength conversion pattern 343_8. In such an embodiment, a greater number of the second opening OP2_7 may be formed in the first wavelength conversion pattern 342_8 to facilitate gas discharge.

Figure 19:
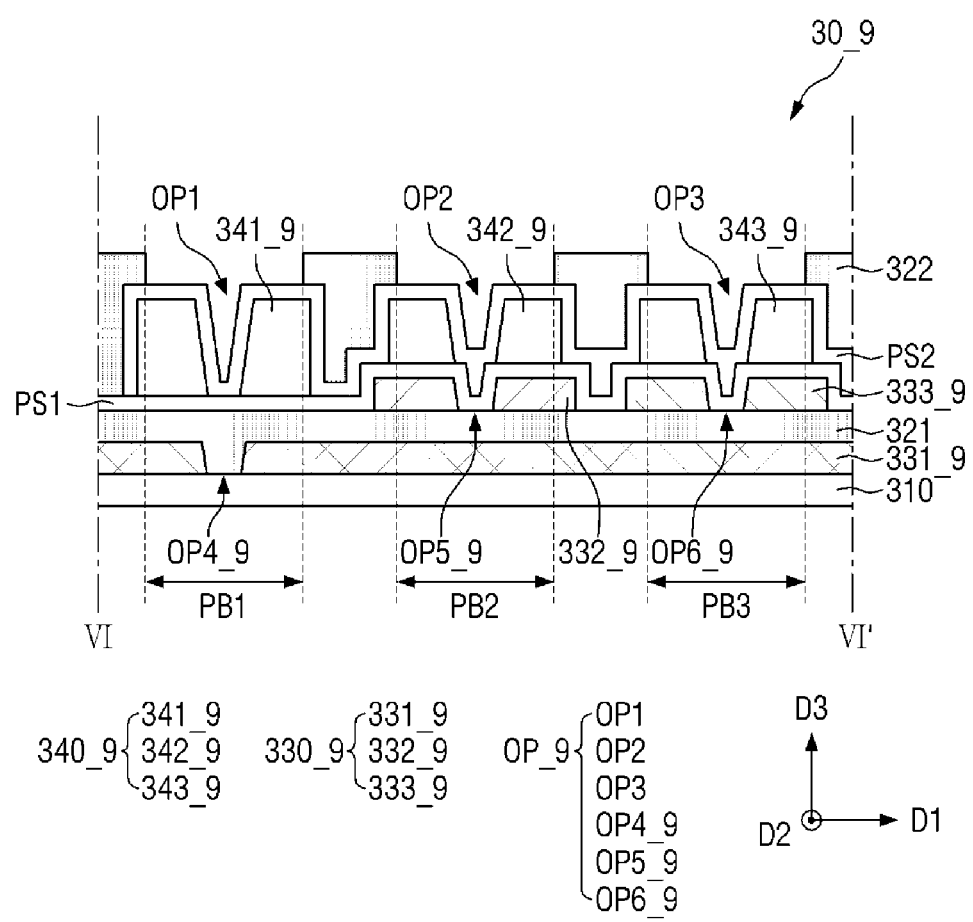
FIG. 19 is a cross-sectional view of a display device according to an alternative embodiment.

FIG. 19 is a cross-sectional view of a display device according to an alternative embodiment. FIG. 19 is a cross-sectional view corresponding to the cross-sectional view taken along line VI-VI' of FIG. 4. The display device of FIG. 19 is substantially the same as the display device of FIGS. 4 through 6 except that a plurality of openings OP_9 is also defined in a color filter 330_9. Therefore, any repetitive detailed description of the same or like elements will be omitted.

Referring to FIG. 19 in addition to FIG. 4, in an embodiment, a color conversion substrate 30_9 may include a second base 310, the color filter 330_9 disposed on the second base 310, and a light modulation pattern 340_9 disposed on the color filter 330_9. The openings OP_9 may be formed in the color filter 330_9 and the light modulation pattern 340_9.

The color filter 330_9 may include a first color filter 331_9, a second color filter 332_9, and a third color filter 333_9.

The first color filter 331_9 may be disposed on a surface of the second base 310 and may at least partially overlap a first light outputting region PA1 and a fourth light outputting region PA4. The first color filter 331_9 may be disposed continuously along the second direction D2 in the first light outputting region PA1 and the fourth light outputting region PA4.

In such an embodiment, the first color filter 331_9 may surround each of the light outputting regions PA1 through P6 in a plan view. The first color filter 331_9 may at least partially overlap the first light outputting region PA1 and the fourth light outputting region PA4, but may not overlap a second light outputting region PA2, a third light outputting region PA3, a fifth light outputting region PA5 and a sixth light outputting region PA6 in a plan view.

The second color filter 332_9 and the third color filter 333_9 may be disposed on the surface of the second base 310.

The second color filter 332_9 may be disposed in the second light outputting region PA2 and the fifth light outputting region PA5. The second color filter 332_9 may be disposed continuously along the second direction D2 in the second light outputting region PA2 and the fifth light outputting region PA5.

The third color filter 333_9 may be disposed in the third light outputting region PA3 and the sixth light outputting region PA6. The third color filter 333_9 may be disposed continuously along the second direction D2 in the third light outputting region PA3 and the sixth light outputting region PA6.

The light modulation pattern 340_9 may include a light transmission pattern 341_9 a first wavelength conversion pattern 342_9, and a second wavelength conversion pattern 343_9.

The light transmission pattern 341_9 may be disposed continuously along the second direction D2 in the first light outputting region PA1 and the fourth light outputting region PA4. The first wavelength conversion pattern 342_9 may be disposed continuously along the second direction D2 in the second light outputting region PA2 and the fifth light outputting region PA5. The second wavelength conversion pattern 343_9 may be disposed continuously along the second direction D2 in the third light outputting region PA3 and the sixth light outputting region PA6.

The openings OP_9 may be defined in the color filter 330_9 and the light modulation pattern 340_9. A first opening OP1, a second opening OP2 and a third opening OP3 may be defined in the light modulation pattern 340_9, and a fourth opening OP4_9, a fifth opening OP5_9 and a sixth opening OP6_9 may be defined in the color filter 330_9.

In an embodiment, the first opening OP1 may be defined in the light transmission pattern 341_9 to overlap a first light shielding region PB1 between the first light outputting region PA1 and the fourth light outputting region PA4. In such an embodiment, the second opening OP2 may be defined in the first wavelength conversion pattern 342_9 to overlap a second light shielding region PB2 between the second light outputting region PA2 and the fifth light outputting region PA5. In such an embodiment, the third opening OP3 may be defined in the second wavelength conversion pattern 343_9 to overlap a third light shielding region PB3 between the third light outputting region PA3 and the sixth light outputting region PA6.

The fourth opening OP4_9 may be defined in the first color filter 331_9 to overlap the first light shielding region PB1 between the first light outputting region PA1 and the fourth light outputting region PA4. The fifth opening OP5_9 may be defined in the second color filter 332_9 to overlap the second light shielding region PB2 between the second light outputting region PA2 and the fifth light outputting region PA5. The sixth opening OP6_9 may be defined in the third color filter 333_9 to overlap the third light shielding region PB3 between the third light outputting region PA3 and the sixth light outputting region PA6.

The fourth opening OP4_9, the fifth opening OP5_9 and the sixth opening OP6_9 may, but not necessarily, at least partially overlap the first opening OP1, the second opening OP2 and the third opening OP3 in the thickness direction.

In an embodiment, where the color filter 330_9 includes or is formed of an organic material, a gas may be generated due to an uncured solvent in the color filter 330_9. This internal gas may create an empty space at the boundary of the color filter 330_9 with the second base 310 or a first capping layer PS1. Since the empty space formed inside the color filter 330_9 has a refractive index different from that of the second base 310 or the first capping layer PS1, an optical interface may be formed. Light incident on the optical interface may be reflected or refracted and thus may not be output to the outside. That is, a region in which the empty space is formed may be seen differently by a user from a region where the empty space is not formed.

In such an embodiment, the fourth opening OP4_9, the fifth opening OP5_9 and the sixth opening OP6_9 are defined in the color filter 330_9, the gas generated inside the color filter 330_9 may be sufficiently or effectively discharged to the outside, thereby reducing the formation of the empty space inside the color filter 330_9.

Figure 20:
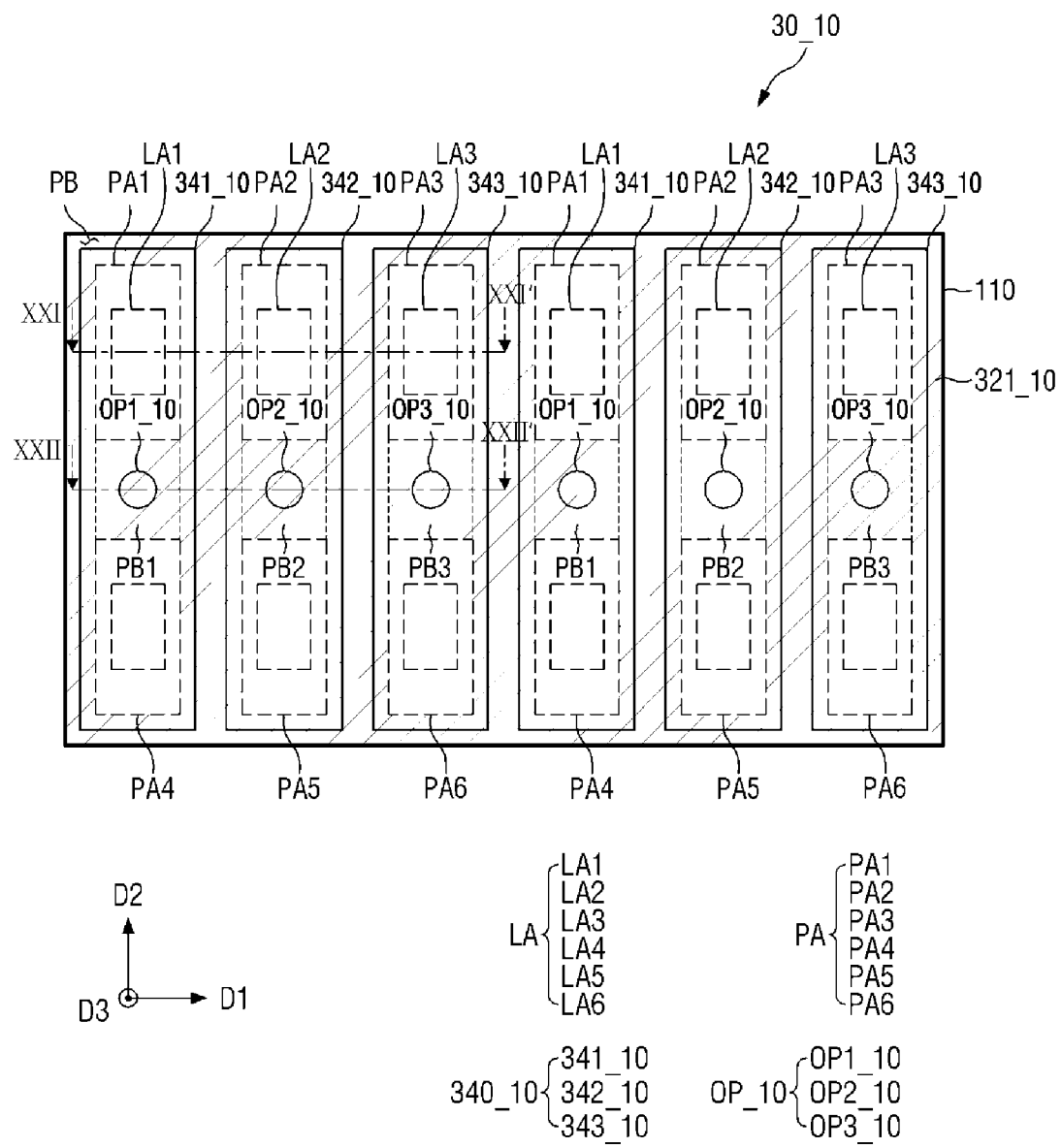
FIG. 20 is a plan view of a display device according to another alternative embodiment.
Figure 21:
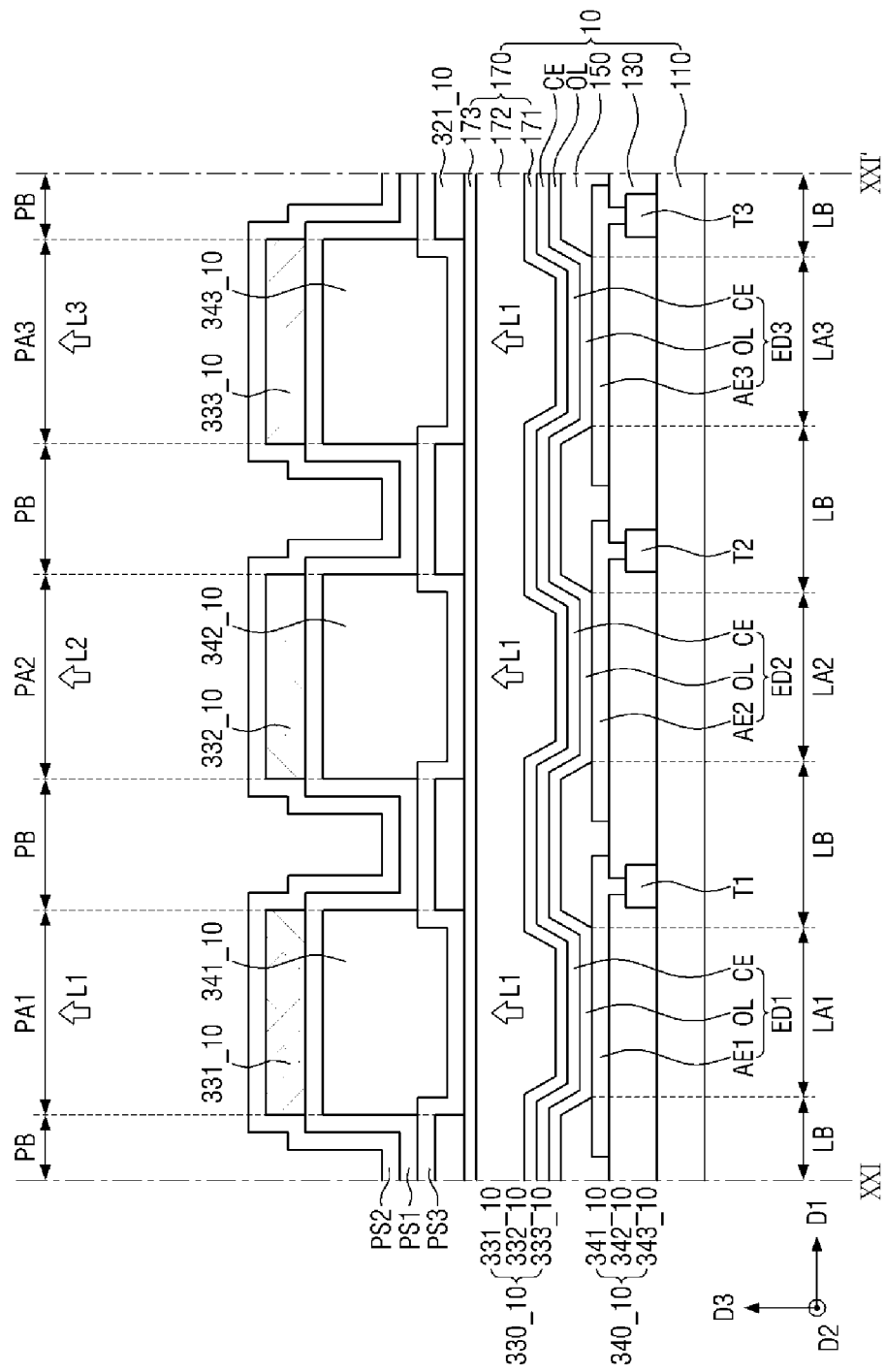
FIGS. 21 and 22 are cross-sectional views taken along line XXI-XXI' and line XXII-XXII' of the display device of the display device of FIG. 20, respectively.
Figure 22:
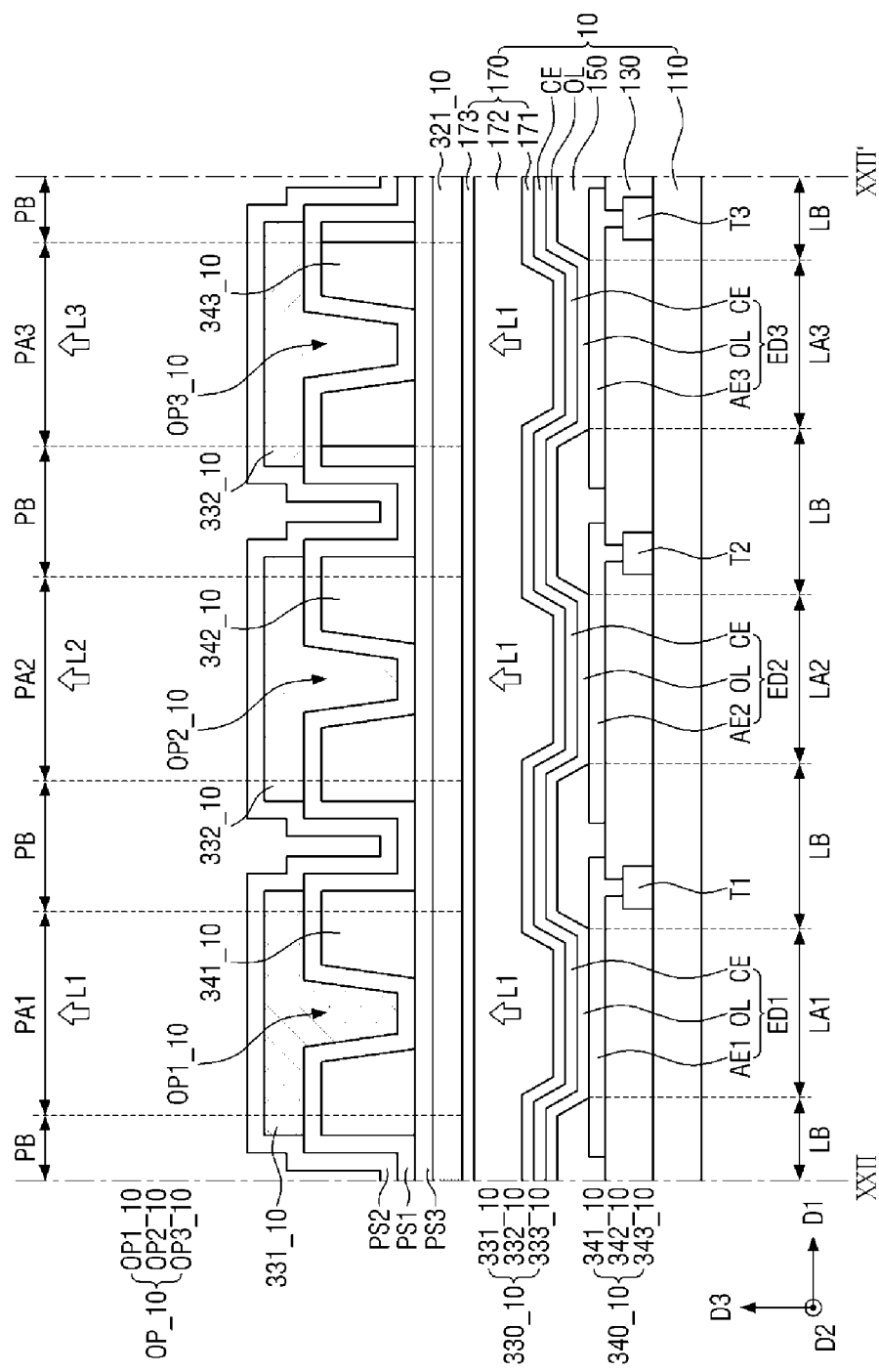

FIG. 20 is a plan view of a display device according to another alternative embodiment. FIGS. 21 and 22 are cross-sectional views taken along line XXI-XXI' and line XXII-XXII' of the display device of FIG. 20, respectively.

The display device of FIGS. 20 through 22 is substantially the same as or similar to the display device of FIGS. 3 through 6 except that the display device 1_10 does not include a color conversion substrate 30_10 and that a light modulation pattern 340_10 and a color filter 330_10 are disposed on a thin-film encapsulation layer 170. Therefore, any repetitive detailed description of the same or like elements will be omitted.

Referring to FIGS. 22 through 22 in addition to FIGS. 3 through 6, an embodiment of the display device 1_10 may include a display substrate 10 and a light shielding member 321_10, the light modulation pattern 340_10 and the color filter 330_10 disposed on the display substrate 10. In such an embodiment, a plurality of openings OP_10 may be defined in the light modulation pattern 340_10.

Referring to FIGS. 20 through 22 in addition to FIGS. 3 through 6, an embodiment of the display device 1_10 may include a display substrate 10 and a light shielding member 321_10, the light modulation pattern 340_10 and the color filter 330_10 disposed on the display substrate 10. In such an embodiment, a plurality of openings OP_10 may be defined in the light modulation pattern 340_10.

The light shielding member 321_10 overlapping the light shielding region PB may be disposed on the thin-film encapsulation layer 170 of the display substrate 10. The light shielding member 321_10 may absorb incident light or reflect at least a portion of the incident light to block transmission of the light. The light shielding member 321_10 may be in a substantially lattice shape in a plan view as illustrated in FIG. 20 and may surround each light outputting region PA.

The light modulation pattern 340_10 may be disposed on the thin-film encapsulation layer 170 and the light shielding member 321_10. The light modulation pattern 340_10 may include a light transmission pattern 341_10, a first wavelength conversion pattern 342_10, and a second wavelength conversion pattern 343_10.

The light transmission pattern 341_10 may be disposed continuously along the second direction D2 in a first light outputting region PA1 and a fourth light outputting region PA4. The first wavelength conversion pattern 342_10 may be disposed continuously along the second direction D2 in a second light outputting region PA2 and a fifth light outputting region PA5. The second wavelength conversion pattern 343_10 may be disposed continuously along the second direction D2 in a third light outputting region PA3 and a sixth light outputting region PA6.

The openings OP_10 may be defined in the light modulation pattern 340_10 to smoothly discharge the gas remaining inside the light modulation pattern 340_10. In such an embodiment, a first opening OP1_10 may be defined in the light transmission pattern 341_10 to overlap a first light shielding region PB1 between the first light outputting region PA1 and the fourth light outputting region PA4. In such an embodiment, a second opening OP2_10 may be defined in the first wavelength conversion pattern 342_10 to overlap a second light shielding region PB2 between the second light outputting region PA2 and the fifth light outputting region PA5. In such an embodiment, a third opening OP3_10 may be defined in the second wavelength conversion pattern 343_10 to overlap a third light shielding region PB3 between the third light outputting region PA3 and the sixth light outputting region PA6.

A first capping layer PS1 may be entirely disposed or provided on the light modulation pattern 340_10. The first capping layer PS1 may effectively prevent impurities such as moisture or air from being introduced from the outside and damaging or contaminating the light shielding member 321_10 and the light modulation pattern 340_10. In such an embodiment, the first capping layer PS1 may effectively prevent a colorant contained in the color filter 330_10 to be formed on the light modulation pattern 340_10 from being diffused to other elements.

The color filter 330_10 may be disposed on the first capping layer PS1. The color filter 330_10 may include a first color filter 331_10, a second color filter 332_10, and a third color filter 333_10.

The first color filter 331_10 may at least partially overlap the first light outputting region PA1 and the fourth light outputting region PA4. The first color filter 331_10 may be disposed continuously along the second direction D2 in the first light outputting region PA1 and the fourth light outputting region PA4.

The second color filter 332_10 may be disposed in the second light outputting region PA2 and the fifth light outputting region PA5. The second color filter 332_10 may be disposed continuously along the second direction D2 in the second light outputting region PA2 and the fifth light outputting region PA5.

The third color filter 333_10 may be disposed in the third light outputting region PA3 and the sixth light outputting region PA6. The third color filter 333_10 may be disposed continuously along the second direction D2 in the third light outputting region PA3 and the sixth light outputting region PA6.

A second capping layer PS2 may be disposed on the color filter 330_10 to entirely cover the color filter 330_10. The second capping layer PS2 may seal the color filter 330_10 and the light modulation pattern 340_10 together with the first capping layer PS1, thereby effectively preventing impurities such as moisture or air from being introduced from the outside and damaging or contaminating the internal elements.

In such an embodiment, a third capping layer PS3 may be further disposed between the light shielding member 321_10 and the light modulation pattern 340_10. The third capping layer PS3 may seal the light shielding member 321_10 together with the thin-film encapsulation layer 170 and may seal the light modulation pattern 340_10 together with the first capping layer PS1. In such an embodiment, the third capping layer PS3 may effectively prevent a colorant contained in the light shielding member 321_10 from being diffused to other elements.

In an embodiment, the color filter 330_10 and the light modulation pattern 340_10 are sequentially formed on the display substrate 10 to form the display device 1_10 without a color conversion substrate as illustrated in FIGS. 20 and 22, such that a thinner display device 1_10 may be obtained. In such an embodiment, since a process for bonding the display substrate 10 with the color conversion substrate is not performed, the process time can be reduced, and the process cost for manufacturing the color conversion substrate may be reduced. In such an embodiment, the display device 1_10 may be manufactured through a low-temperature process to effectively prevent an organic light emitting layer OL of the display substrate 10 from being damaged in a high-temperature process.

In such an embodiment, where the light modulation pattern 340_10 is formed by a low-temperature process, the light modulation pattern 340_10 may not be cured sufficiently, and a large amount of gas may be generated. Therefore, in such an embodiment, a plurality of openings OP_10 are defined or formed in the light modulation pattern 340_10 as described above, such that the gas formed inside the light modulation pattern 340_10 may be smoothly discharged to the outside. Accordingly, the display quality and reliability of the display device 1_10 can be improved.

In an embodiment, as shown in FIG. 22, the openings OP_10 expose the third capping layer PS3. Alternatively, the openings OP_10 may be defined not to expose the third capping layer PS3 as shown in FIG. 8.

In an embodiment, the openings OP_10 may be defined only in the light modulation pattern 340_10 as shown in FIGS. 20 through 22. Alternatively, the openings OP_10 may be defined in the color filter 330_10 as in FIG. 19 to discharge the gas inside the color filter 330_10.

According to embodiments, a color conversion substrate may improve display quality by effectively discharging gas generated in a wavelength conversion pattern.

According to embodiments, a display device has improved display quality by effectively discharging gas generated in a wavelength conversion pattern.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to some embodiments thereof, it will be understood by those of ordinary skill in the art that various changes in form and details may be made therein without departing from the spirit or scope of the invention as defined by the following claims.

What is claimed is:

1. A color conversion substrate comprising:
    a base on which a first light outputting region, a second light outputting region and a third light outputting region sequentially disposed to be spaced apart from each other along a first direction, and a light shielding region surrounding each of the first to third light outputting regions are defined;
    a first color filter disposed on the base and disposed in the first light outputting region and the light shielding region;
    a second color filter disposed on the base and disposed in the second light outputting region;
    a third color filter disposed on the base and disposed in the third light outputting region;
    a first light shielding member disposed on the first color filter and disposed in the light shielding region;
    a light transmission pattern disposed on the first color filter;
    a first wavelength conversion pattern disposed on the second color filter, wherein the first wavelength conversion pattern converts light of a first color into light of a second color;
    a second wavelength conversion pattern disposed on the third color filter, wherein the second wavelength conversion pattern converts the light of the first color into light of a third color, which is different from the second color, and
    a capping layer disposed between the first color filter and the light transmission pattern and between the second color filter and the first wavelength conversion pattern wherein the light transmission pattern, the first wavelength conversion pattern and the second wavelength conversion pattern are spaced apart from each other,
    a first opening is formed as a through hole through an entire thickness defining at least one of the light transmission pattern, the first wavelength conversion pattern and the second wavelength conversion pattern,
    the first opening is located in the light shielding region the first opening exposes the capping layer.

2. The color conversion substrate of claim 1, wherein
    a fourth light outputting region disposed adjacent to the first light outputting region along a second direction intersecting the first direction, a fifth light outputting region disposed adjacent to the second light outputting region along the second direction, and a sixth light outputting region disposed adjacent to the third light outputting region are further defined on the base,
    the light shielding region comprises:
    a first light shielding region disposed between the first light outputting region and the fourth light outputting region;
    a second light shielding region disposed between the second light outputting region and the fifth light outputting region; and
    a third light shielding region disposed between the third light outputting region and the sixth light outputting region, and
    wherein the first opening is located in the second light shielding region.

3. The color conversion substrate of claim 2, wherein a second opening is defined in a portion of the second wavelength conversion pattern located in the third light shielding region.

4. The color conversion substrate of claim 3, wherein a third opening is defined in a portion of the light transmission pattern located in the first light shielding region.

5. The color conversion substrate of claim 4, wherein an area of the first opening in a plan view is larger than an area of the second opening in the plan view and an area of the third opening in the plan view.

6. The color conversion substrate of claim 4, wherein
    each of the first opening, the second opening and the third opening is provided in plural, and
    a number of the first openings is greater than a number of the second openings or a number of the third openings.

7. The color conversion substrate of claim 1, wherein
    the first color filter transmits the light of the first color and blocks the light of the second color and the light of the third color,
    the second color filter transmits the light of the second color and blocks the light of the first color and the light of the third color, and
    the third color filter transmits the light of the third color and blocks the light of the first color and the light of the second color.

8. The color conversion substrate of claim 7, wherein the first light shielding member contacts the first color filter and is spaced apart from the base.

9. The color conversion substrate of claim 8, wherein a fourth opening is defined in at least one of the first color filter, the second color filter and the third color filter, and overlaps the light shielding region.

10. The color conversion substrate of claim 7, further comprising:

a first capping layer disposed on the base, wherein the first capping layer covers the first color filter, the second color filter, the third color filter and the first light shielding member, wherein the light transmission pattern, the first wavelength conversion pattern and the second wavelength conversion pattern are disposed on the first capping layer, and the first opening exposes the first capping layer.

11. The color conversion substrate of claim 10, further comprising:

a second capping layer disposed on the first capping layer, wherein the second capping layer covers the light transmission pattern, the first wavelength conversion pattern and the second wavelength conversion pattern; and a second light shielding member disposed on the second capping layer and disposed between the light transmission pattern and the first wavelength conversion pattern and between the first wavelength conversion pattern and the second wavelength conversion pattern.

12. A display device comprising:

a first base on which a first light emitting region and a second light emitting region are defined;

a first light emitting element disposed on the first base and disposed in the first light emitting region;

a second light emitting element disposed on the first base and disposed in the second light emitting region;

a thin-film encapsulation layer disposed on the first light emitting element and the second light emitting element;

a second base disposed on the thin-film encapsulation layer, wherein a first light outputting region overlapping the first light emitting region, a second light outputting region overlapping the second light emitting region and a light shielding region surrounding each of the first and second light outputting regions are defined on the second base;

a blue color filter disposed on a surface of the second base facing the thin-film encapsulation layer and disposed in the first light outputting region and the light shielding region;

a green color filter disposed on the surface of the second base and disposed in the second light outputting region;

a light shielding member disposed on the blue color filter and disposed in the light shielding region;

a light transmission pattern disposed on the blue color filter;

a wavelength conversion pattern disposed on the green color filter; and a capping layer disposed between the blue color filter and the light transmission pattern and between the green color filter and the wavelength conversion pattern, wherein the light transmission pattern and the wavelength conversion pattern are spaced apart from each other, a first opening is formed in at least one of the light transmission pattern and the wavelength conversion pattern, the first opening is located in the light shielding region, and the first opening exposes the capping layer.

13. The display device of claim 12, wherein the first light outputting region and the second light outputting region are sequentially disposed to be spaced apart from each other along a first direction, a third light outputting region disposed adjacent to the first light outputting region along a second direction intersecting the first direction, a fourth light outputting region disposed adjacent to the second light outputting region along the second direction, a first light shielding region disposed between the first light outputting region and the third light outputting region, and a second light shielding region disposed between the second light outputting region and the fourth light outputting region are further defined on the second base, and the first opening is located in at least one of the first light shielding region and the second light shielding region.

14. The display device of claim 13, wherein the wavelength conversion pattern comprises a base resin and quantum dots dispersed in the base resin.

15. The display device of claim 12, further comprising:

a sealing portion disposed along edges of the first base and the second base, wherein the first base and the second base are bonded to each other by the sealing portion.

16. The display device of claim 15, further comprising:

a capping layer disposed on the light transmission pattern and the wavelength conversion pattern; and a filler disposed between the thin-film encapsulation layer and the capping layer, wherein the filler directly contacts the capping layer.

17. A display device comprising:

a base on which a first light emitting region and a second light emitting region are defined;

a first light emitting element disposed on the base and disposed in the first light emitting region;

a second light emitting element disposed on the base and disposed in the second light emitting region;

a thin-film encapsulation layer disposed on the first light emitting element and the second light emitting element;

a light shielding member disposed on the thin-film encapsulation layer and disposed along a boundary of each of the first light emitting region and the second light emitting region;

a light transmission pattern disposed on the thin-film encapsulation layer, wherein the light transmission pattern overlaps the first light emitting region in a plan view;

a wavelength conversion pattern disposed on the thin-film encapsulation layer, where in the wavelength conversion pattern overlaps the second light emitting region in the plan view;

a blue color filter disposed on the light transmission pattern;

a green color filter disposed on the wavelength conversion pattern, and a capping layer disposed between the blue color filter and the light transmission pattern and between the green color filter and the wavelength conversion pattern, wherein the light transmission pattern and the wavelength conversion pattern are spaced apart from each other, a first opening is formed in at least one of the light transmission pattern and the wavelength conversion pattern, the first opening overlaps the light shielding member in the plan view, and the first opening exposes the capping layer.

18. The display device of claim 17, wherein the first light emitting region and the second light emitting region are sequentially disposed to be spaced apart from each other along a first direction, a third light emitting region disposed adjacent to the first light emitting region along a second direction intersecting the first direction and a fourth light emitting region disposed adjacent to the second light emitting region along the second direction are further defined on the base, and the first opening is located between the first light emitting region and the third light emitting region or between the second light emitting region and the fourth light emitting region.

19. The display device of claim 18, wherein a second opening is defined in at least one of the first color filter and the second color filter.

* * * * *